United States Patent
Lin

(10) Patent No.: US 9,691,936 B2
(45) Date of Patent: Jun. 27, 2017

(54) MANUFACTURING METHOD OF LED CARRIER

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventor: Chen-Hsiu Lin, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/083,637

(22) Filed: Mar. 29, 2016

(65) Prior Publication Data

US 2016/0211407 A1 Jul. 21, 2016

Related U.S. Application Data

(62) Division of application No. 14/642,400, filed on Mar. 9, 2015.

(30) Foreign Application Priority Data

Apr. 23, 2014 (CN) .......................... 2014 1 0166461

(51) Int. Cl.
*H01L 33/48* (2010.01)
*H01L 33/00* (2010.01)
*H01L 33/62* (2010.01)
*H01L 33/60* (2010.01)
*H01L 25/075* (2006.01)

(52) U.S. Cl.
CPC ............ *H01L 33/005* (2013.01); *H01L 33/60* (2013.01); *H01L 33/62* (2013.01); *H01L 25/0753* (2013.01); *H01L 2924/0002* (2013.01); *H01L 2933/0033* (2013.01); *H01L 2933/0058* (2013.01); *H01L 2933/0066* (2013.01)

(58) Field of Classification Search
CPC .................................................. H01L 27/3262
See application file for complete search history.

(56) References Cited

U.S. PATENT DOCUMENTS

| | | | | |
|---|---|---|---|---|
| 9,214,607 | B1* | 12/2015 | Andrews | ............... H01L 33/486 |
| 2005/0018420 | A1* | 1/2005 | Parsons | ................ A44B 15/005 |
| | | | | 362/190 |
| 2007/0194340 | A1* | 8/2007 | Akiba | .................. H05K 1/0203 |
| | | | | 257/99 |

(Continued)

*Primary Examiner* — Thao P Le
(74) *Attorney, Agent, or Firm* — Li & Cai Intellectual Property (USA) Office

(57) ABSTRACT

An LED carrier includes a substrate, a metallic layer, an insulating layer, and a reflecting layer. The metallic layer is disposed on the substrate and has a die bonding region and a ring-shaped wiring region separated from the die bonding region. A region arranged between the die bonding region and the ring-shaped wiring region is defined as an insulating region. The insulating layer at least partially covers the insulating region. The reflecting layer is arranged above the die bonding region and at least partially covers the top surface of the insulating layer. Moreover, the instant disclosure also provides a manufacturing method of an LED carrier.

20 Claims, 19 Drawing Sheets

(56) References Cited

U.S. PATENT DOCUMENTS

| | | | | |
|---|---|---|---|---|
| 2011/0079803 A1* | 4/2011 | Chiang | ............... | H01L 23/3677 |
| | | | | 257/98 |
| 2011/0310624 A1* | 12/2011 | Preuschl | ............... | F21V 23/002 |
| | | | | 362/373 |
| 2014/0146536 A1* | 5/2014 | Li | ......................... | H05K 1/119 |
| | | | | 362/249.02 |
| 2014/0299894 A1* | 10/2014 | Lin | .......................... | F21K 9/00 |
| | | | | 257/88 |
| 2015/0249072 A1* | 9/2015 | Herrmann | ............. | H01L 25/167 |
| | | | | 257/99 |

* cited by examiner

MANUFACTURING METHOD OF LED CARRIER

CROSS REFERENCE TO RELATED APPLICATION

The present application is a divisional application of application Ser. No. 14/642,400, filed on Mar. 9, 2015 and entitled "LED CARRIER AND MANUFACTURING METHOD THEREOF", now allowed. Moreover, this divisional application rejoins claims based on Group II, according to the Restriction Requirement dated Oct. 8, 2015, augmented with new claims supported by original specification.

BACKGROUND OF THE DISCLOSURE

1. Field of the Disclosure

The instant disclosure relates to a carrier; in particular, to an LED carrier and a manufacturing method thereof.

2. Description of Related Art

The conventional LED carrier usually includes a substrate, a dielectric layer, and a metallic layer. The dielectric layer is disposed on the substrate, and the metallic layer is disposed on the dielectric layer. Due to the side wall of the metallic layer is always exposed to air, such that the exposed side wall of the metallic layer is easily oxidized. Furthermore, the chemical etching is usually used in the manufacturing process for forming the metallic layer, and the etching agent is easily resided thereinside. It leads to degradation of light output for the LED package structure.

To achieve the abovementioned improvement, the inventors strive through industrial experience and academic research to present the instant disclosure, which can provide additional improvement as mentioned above.

SUMMARY OF THE DISCLOSURE

One embodiment of the instant disclosure provides an LED carrier and a manufacturing method thereof for effectively solving the problem that the side wall of the metallic layer is exposed to the air.

The LED carrier and the manufacturing method thereof according to the instant disclosure are provided with the insulating layer arranged in the insulating region, such that the side wall of the metallic layer is not exposed to the air. That is to say, with the insulating layer entirely covering the side walls of the die bonding region and the ring-shaped region, the side wall of the die bonding region is not exposed. The degradation of light output can be avoided due to the side wall of the die bonding region is not oxidized and the etching agent is not resided thereinside.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

First Embodiment

Please refer to FIGS. 1A through 7, which show a first embodiment of the instant disclosure. References are hereunder made to the detailed descriptions and appended drawings in connection with the instant disclosure. However, the appended drawings are merely shown for exemplary purposes, rather than being used to restrict the scope of the instant disclosure.

Figure 2A:
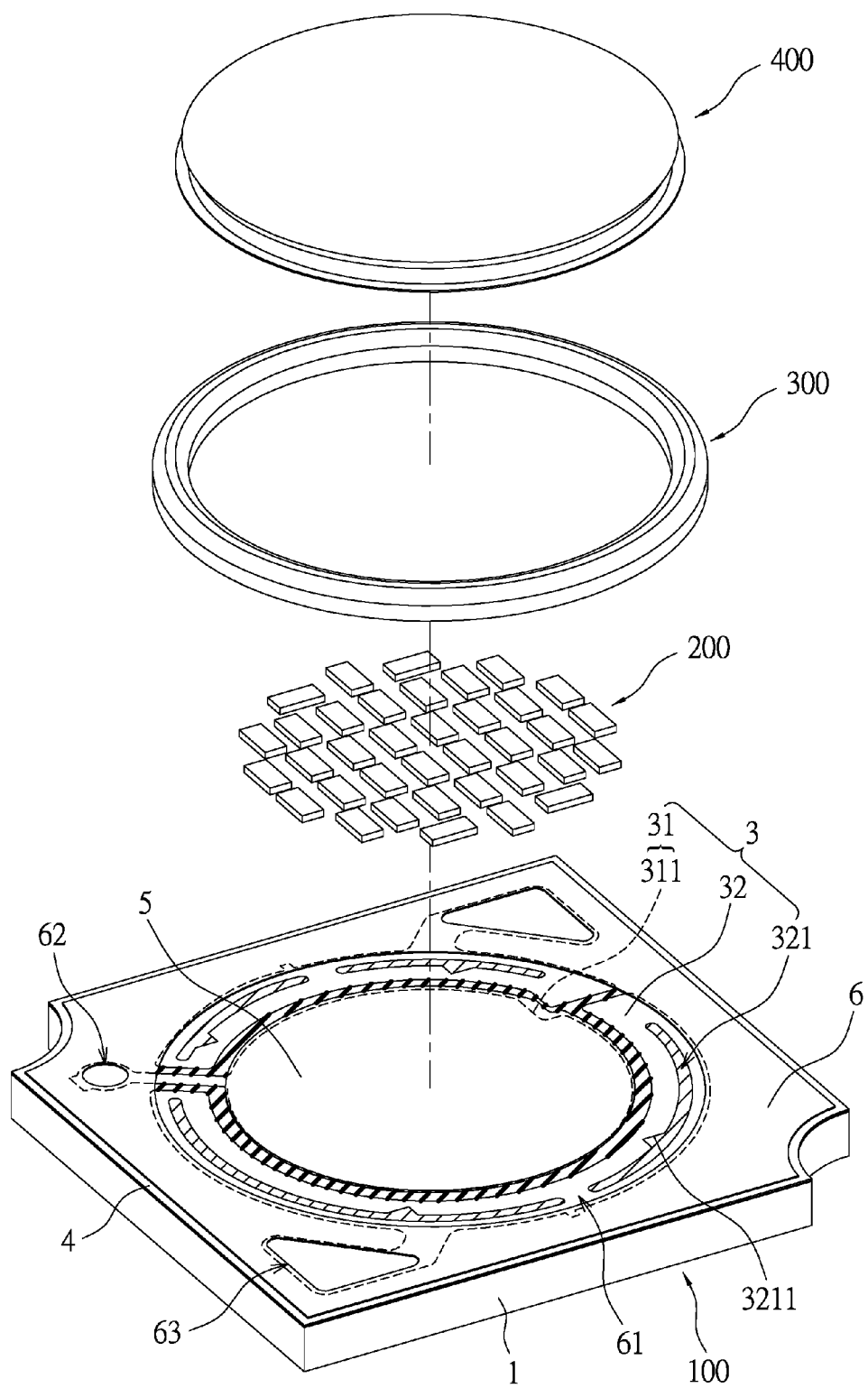
FIG. 2A is an exploded view of FIG. 1A.

Please refer to FIG. 2A. The instant embodiment provides an LED package structure including an LED carrier 100, a plurality of LED dies 200 mounted on the LED carrier 100, a reflecting frame 300, and an encapsulation body 400. The encapsulation body 400 may have fluorescent powders mixed therein, but is not limited thereto. The following description discloses the detailed structure of the LED carrier 100, and then discloses the relationship between the LED carrier 100 and the other components.

Figure 3:
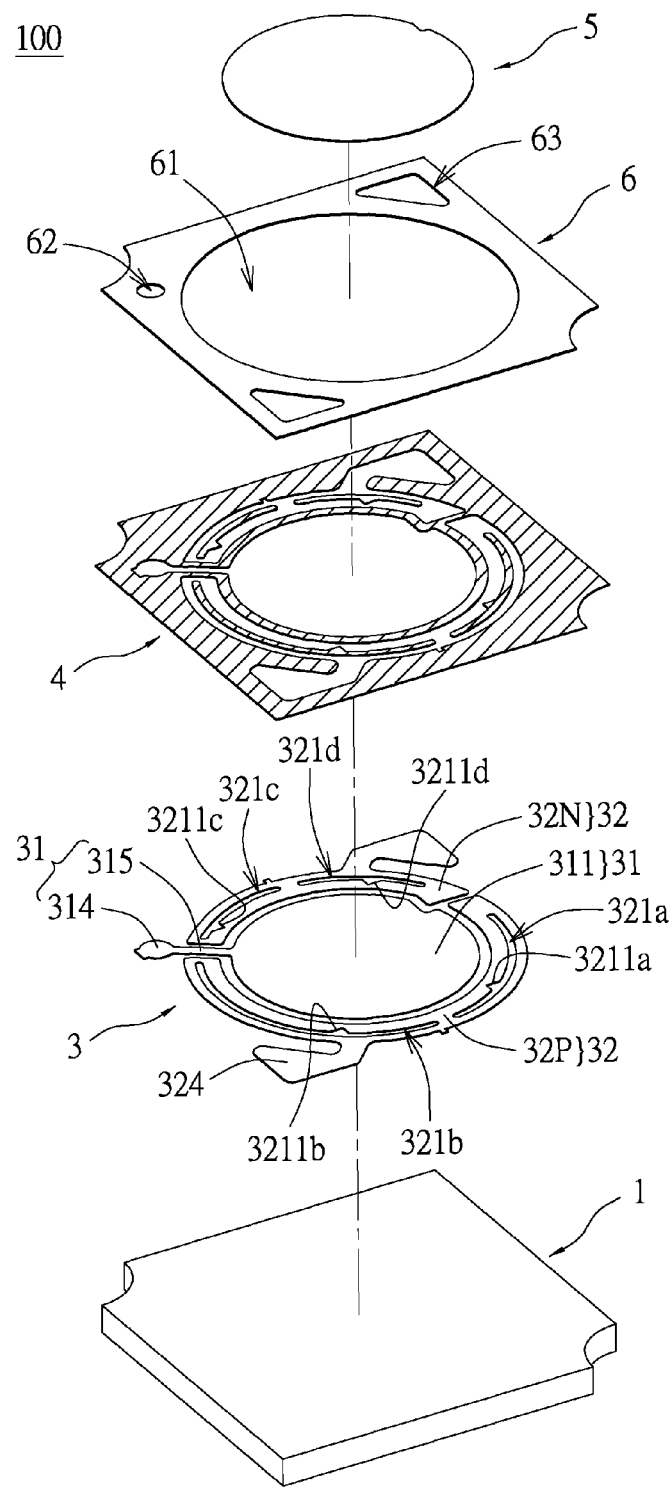
FIG. 3 is an exploded view showing the LED carrier of FIG. 2A.

Please refer to FIGS. 2A and 3. The LED carrier 100 provided by the instant embodiment includes a substrate 1, a metallic layer 3, an insulating layer 4, a solder-resist layer 6, and a reflecting layer 5. The metallic layer 3, the insulating layer 4, the solder-resist layer 6, and the reflecting layer 5 are substantially disposed on the substrate 1 in sequence. Moreover, the substrate 1 may be a metallic substrate or an insulating substrate. When the substrate 1 is the metallic substrate, a dielectric layer (not shown) is disposed between the metallic substrate and the metallic layer 3, the dielectric layer covers one surface of the metallic substrate, and the edge of the dielectric layer is substantially aligned with the edge of the metallic substrate. The metallic substrate can be an aluminum substrate or a copper substrate, but is not limited thereto. The insulating substrate can be a ceramic substrate or a resin substrate.

The metallic layer 3 (e.g., copper foil) is disposed on the substrate 1 and has a first pattern. The first pattern includes a die bonding region 31 and a ring-shaped wiring region 32 separated from the die bonding region 31. The die bonding region 31 has a circle-shaped main portion 311 with large scale arranged on the center of the substrate 1, a circle-shaped temperature sensing portion 314 with relatively smaller scale when compared to the circle-shaped main portion 311, and an extending portion 315 connecting the main portion 311 to the temperature sensing portion 314. The ring-shaped wiring region 32 surrounds the main portion 311 of the die bonding region 31 to substantially resemble a ring shape. The ring-shaped wiring region 32 can be defined as two portions 32P, 32N, such as a positive electrode circuit 32P and a negative electrode circuit 32N. Moreover, the main portion 311 is arranged inside the two portions 32P, 32N of the ring-shaped wiring region 32, the extending portion 315 passes through one adjacent side of the two portions 32P, 32N of the ring-shaped wiring region 32, and the temperature sensing portion 314 is arranged outside the two portions 32P, 32N of the ring-shaped wiring region 32. The two portions 32P, 32N of the ring-shaped wiring region 32 each has a soldering pad 324, and the two soldering pads 324 are correspondingly arranged at two opposing corners of the substrate 1.

Figure 2B:
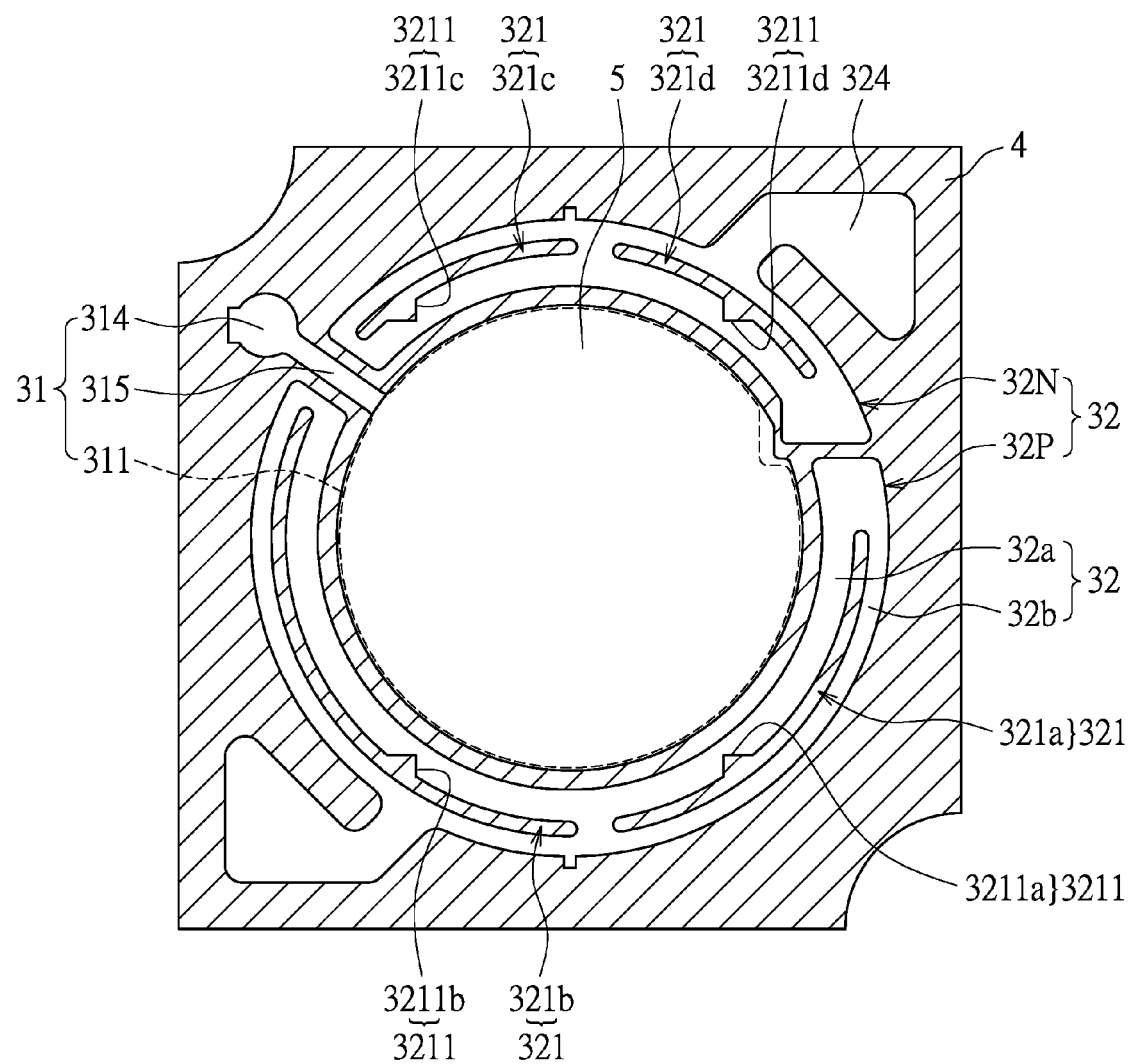
FIG. 2B is a top view showing the LED carrier of FIG. 2A as a solder-resist layer is omitted.

Specifically, each of the two portions 32P, 32N of the ring-shaped wiring region 32 has two arc slots 321, and the four arc slots 321 of the ring-shaped wiring region 32 (i.e., the first slot 321a, the second slot 321b, the third slot 321c, and the fourth slot 321d) substantially surround the main portion 311 of the die bonding region 31 so as to substantially resemble an arc-shaped slot. Each of the arc slots 321 has a V-shaped notch 3211. That is to say, the first slot 321a, the second slot 321b, the third slot 321c, and the fourth slot 321d respectively have a first V-shaped notch 3211a, a second V-shaped notch 3211b, a third V-shaped notch 3211c, and a fourth V-shaped notch 3211d. An opening of the V-shaped notch 3211 of each arc slot 321 faces away from the main portion 311 of the die bonding region 31 and has a right angle of about ninety degrees. The arc slots 321 of the ring-shaped wiring region 32 are substantially respectively arranged at four quadrants, a pair of the V-shaped notches 3211 (i.e., the two V-shaped notches 3211a and 3211c as shown in FIG. 2B) are disposed in a symmetry manner by passing through a circle center of the main portion 311, and another pair of the V-shaped notches 3211 (i.e., the two V-shaped notches 3211b and 3211d as shown in FIG. 2B) are also disposed in a symmetry manner by passing through the circle center of the main portion 311, thereby providing a plurality of position marks for disposing LED dies 200. However, the arc slots 321 of the ring-shaped wiring region 32 are not limited to the above conditions. For example, the number of the arc slot 321 of each portion of the ring-shaped wiring region 32 is one, and the two slots 321 of the ring-shaped wiring region 32 are disposed in a symmetry manner by passing through the circle center of the main portion 311.

The insulating layer 4 has a second pattern. The insulating layer 4 is disposed on a portion of the substrate 1 not covered by the metallic layer 3, and the second pattern of the insulating layer 4 is complementary to the first pattern of the metallic layer 3. Moreover, a top surface of the metallic layer 3 and a top surface of the insulating layer 4 are coplanar, and the edge of the insulating layer 4 is substantially aligned with the edge of the substrate 1. The material of the insulating layer 4 is preferably a solder-resist ink, silicone, ceramic ink, or thermosetting resin, but is not limited thereto.

Please refer to FIG. 2A. The solder-resist layer 6 is substantially disposed on the insulating layer 4, and a covering region of the insulating layer 4 covered by the solder-resist layer 6 is slightly smaller than the top surface of the insulating layer 4, that is to say, the covering region of the insulating layer 4 covered by the solder-resist layer 6 is arranged inside the outer edge of the insulating layer 4 by a distance. The solder-resist layer 6 has a circular opening 61 substantially surrounding the outer edges of the slots 321, and the slots 321 are in air communication with the opening 61. The circular opening 61 provides a circular region for mounting the LED dies 200 thereon. The opening of the V-shaped notch 3211 of each slot 321 faces the solder-resist layer 6 to facilitate the locations of the LED dies 200.

Moreover, the solder-resist layer 6 further has a circular opening 62 and two triangular openings 63 arranged outside the opening 61. The position of the opening 62 substantially corresponds to that of the temperature sensing portion 314, such that the temperature sensing portion 314 is exposed from the solder-resist layer 6 via the opening 62 to facilitate sensing temperature of the die bonding region 31 that the at least one LED die 200 is mounted thereon. The positions of the two openings 63 respectively and substantially correspond to the two soldering pads 324, so that the two soldering pads 324 are exposed from the solder-resist layer 6 via the openings 63 in order to connect to an external power.

Figure 4A:
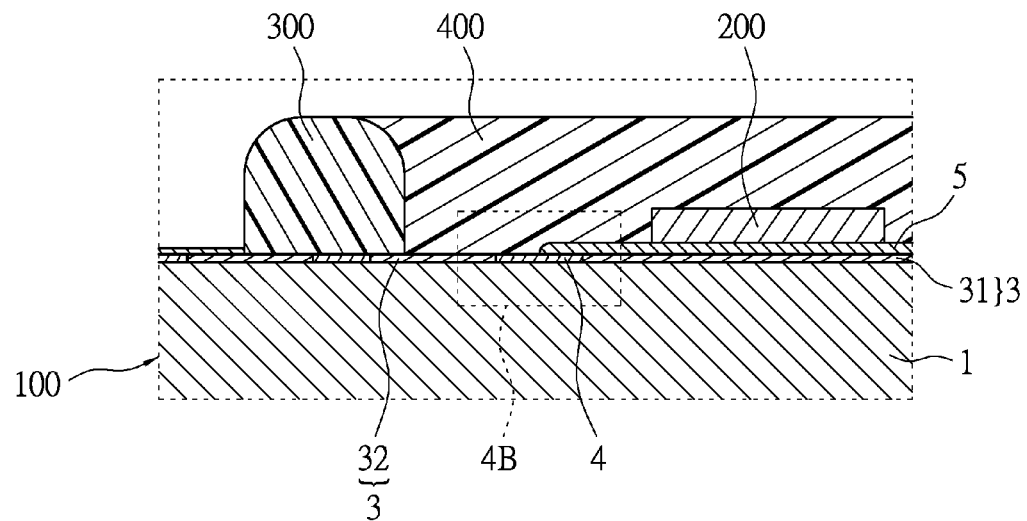
FIG. 4A is a cross-sectional view of FIG. 1A along line 4A-4A.

The reflecting layer 5 is disposed on the top surface of the main portion 311 of the die bonding region 31 and is extended to cover part of the top surface of the insulating layer 4 (as shown in FIGS. 2B and 4A). A light reflectivity of the reflecting layer 5 for the light having a wavelength of 400~470 nm is at least 80%. The material of the reflecting layer 5 can be selected from the group consisting of solder-resist ink, silicone, and ceramic ink. The material of the insulating layer 4 can be selected from the group consisting of solder-resist ink, silicone, ceramic ink, and thermosetting resin. In other words, the material of the reflecting layer 5 can be identical to or different from the material of the insulating layer 4. For example, when the materials of the reflecting layer 5 and the insulating layer 4 are ceramic ink, the light reflectivity of the LED carrier 100 for the light having a wavelength of 400~470 nm is almost 97%; or, when the material of the reflecting layer 5 is ceramic ink and the material of the insulating layer 4 is silicone, the light reflectivity of the LED carrier 100 for the light having a wavelength of 400~470 nm is also about 97%. However, the material of the reflecting layer 5 or the insulating layer 4 is not limited to the instant embodiment. Thus, the light generated from the LED dies 200 disposed on the reflecting layer 5 can be effectively reflected by choosing the material of the reflecting layer 5, thereby increasing the light emitting performance of the LED package structure.

Figure 4B:
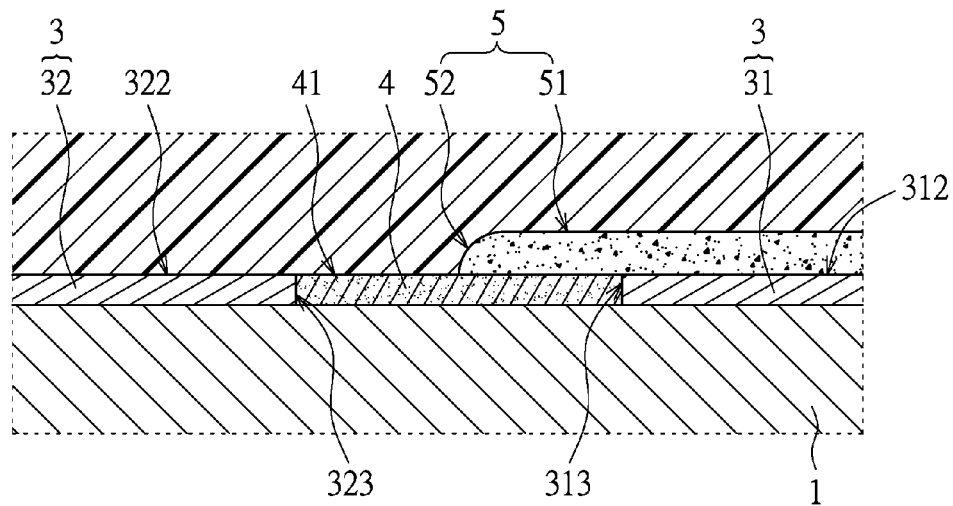
FIG. 4B is an enlarged view showing the region 4B of FIG. 4A.

The above description is the schematic description of the LED carrier 100 of the instant embodiment. Please refer to FIGS. 4A and 4B. The following description further discloses the detail relationships of the substrate 1, the metallic layer 3, a portion of the insulating layer 4 arranged between the die bonding region 31 and the ring-shaped wiring region 32, and the reflecting layer 5. The LED carrier 100 is substantially symmetrical to the center thereof, the following description only refers to FIG. 4A in order to introduce the construction of one side of the LED package structure in FIG. 1A. Moreover, the die bonding region 31 disclosed in the description of the FIGS. 4A and 4B is the main portion 311.

Figure 5A:
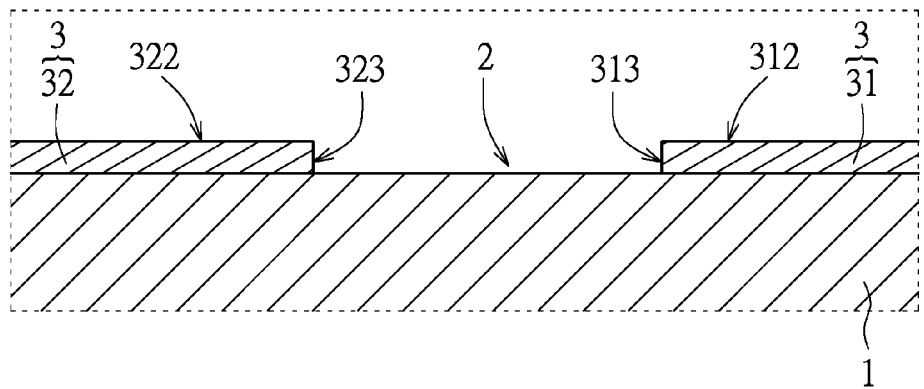
FIG. 5A is a cross-sectional view showing the step S110 of the first embodiment of the instant disclosure.

Each of the die bonding region 31 and the ring-shaped wiring region 32 has a top surface 312, 322 faced away from the top surface of the substrate 1 and a side wall 313, 323 respectively arranged between the top surface 312, 322 and the top surface of the substrate 1. A region arranged between the side wall 313 of the die bonding region 31 and the side wall 323 of the ring-shaped wiring region 32 is defined as an insulating region 2 (as shown in FIG. 5A). The insulating layer 4 is filled in the insulating region 2 that is arranged between the side wall 313 of the die bonding region 31 and the side wall 323 of the ring-shaped wiring region 32, and the insulating layer 4 has a top surface 41 faced away from the substrate 1. Specifically, the top surface 41 of the insulating layer 4, the top surface 312 of the die bonding region 31, and the top surface 322 of the ring-shaped wiring region 32 are substantially coplanar. An arithmetical mean roughness (Ra) of the top surface 41 of the insulating layer 4, the top surface 312 of the die bonding region 31, and the top surface 322 of the ring-shaped wiring region 32 is smaller than or equal to 1 μm, and a ten-point mean roughness (Rz) of the top surface 41 of the insulating layer 4, the top surface 312 of the die bonding region 31, and the top surface 322 of the ring-shaped wiring region 32 is smaller than or equal to 5 μm. Thus, the sidewall 313 of the die bonding region 31 is not exposed to air, so that the sidewall 313 of the die bonding region 31 is prevented from being oxidized and the degradation of light output due to the residual etching agent is avoided. In the instant embodiment, the width of the insulating region 2 is about 75~300 μm, and the height of the insulating region 2 is at least 18 μm.

The reflecting layer 5 covers the top surface 312 of the die bonding region 31 and is extended to cover part of the top surface 41 of the insulating layer 4 (i.e., the covering area of the reflecting layer 5 is greater than the area of the top surface 312 of the die bonding region 31), so that the die bonding region 31 is arranged inside a reflecting region defined by orthogonally projecting the reflecting layer 5 onto the substrate 1. The reflecting layer 5 has a flat surface 51 and a curved surface 52 surrounding the flat surface 51. The flat surface 51 is located above the top surface 312 of the die bonding region 31 and is substantially parallel to the top surface 312 of the die bonding region 31, and the curved surface 52 is located above the insulating layer 4. When forming the reflecting layer 5, sagging phenomenon of the returning ink is usually happened on the curved surface 52.

Therefore, the flat surface 51 of the reflecting layer 5 is still flat enough for mounting the LED dies 200.

The detail relationships of the substrate 1, the metallic layer 3, the insulating layer 4, and the reflecting layer 5 disclosed in the above description are produced by an unique manufacturing method, and the following description discloses the manufacturing method according to cross-sectional view. Moreover, the components in the following description identical to the above description (i.e., the definition and the material of the top surfaces 312, 322, 41 and the insulating region 2) are not disclosed again. The manufacturing method includes the steps as follows:

In step S110, as shown in FIG. 5A, the metallic layer 3 having the first pattern is disposed on the substrate 1. Specifically, the first pattern includes the die bonding region 31 and the ring-shaped wiring region 32 separated from the die bonding region 31, and the top surface 312 of the die bonding region 31 and the top surface 322 of the ring-shaped wiring region 32 are coplanar.

Figure 5B:
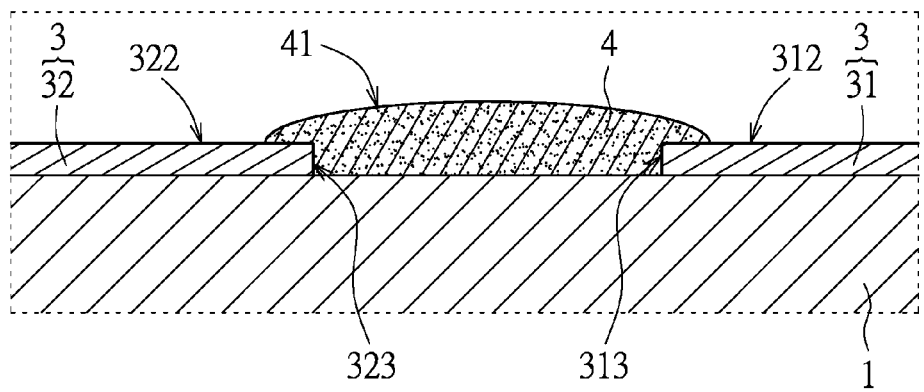
FIG. 5B is a cross-sectional view showing the step S130 of the first embodiment of the instant disclosure.

In step S130, as shown in FIG. 5B, the insulating layer 4 made of insulating material is formed on the substrate 1 by filling the insulating material in the insulating region 2 (i.e., the insulating region 2 defined by the side wall 313 of the die bonding region 31, the side wall 323 of the ring-shaped wiring region 32, and the top surface of the substrate 1). Specifically, the top surface 41 of the insulating material protrudes from the top surface 312 of the die bonding region 31 and the top surface 322 of the ring-shaped wiring region 32 so as to cover the adjacent top surfaces 312, 322, the side wall 313 of the die bonding region 31, and the side wall 323 of the ring-shaped wiring region 32. Moreover, when the material of the insulating layer 4 is solder-resist ink, the insulating layer 4 is formed by photolithography; when the material of the insulating layer 4 is silicone or ceramic ink, the insulating layer 4 is formed by screen printing.

Figure 5C:
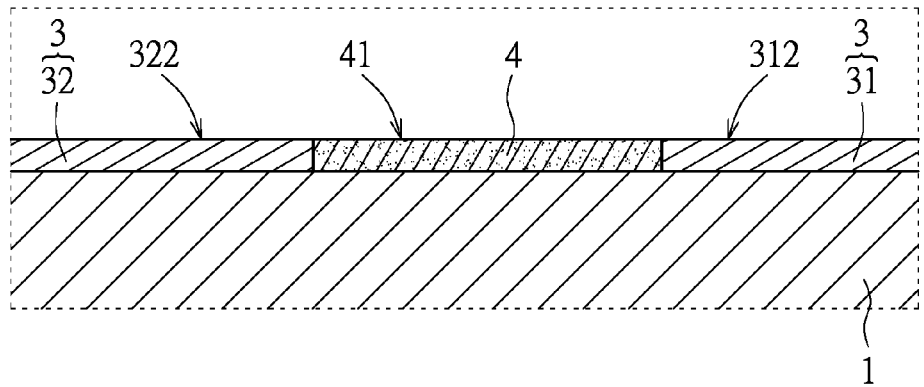
FIG. 5C is a cross-sectional view showing the step S150 of the first embodiment of the instant disclosure.

In step S150, as shown in FIG. 5C, a flattening process is implemented to polish the top surface 41 of the insulating layer 4, the top surface 312 of the die bonding region 31, and the top surface 322 of the ring-shaped wiring region 32, so that the top surface 41 of the insulating layer 4, the top surface 312 of the die bonding region 31, and the top surface 322 of the ring-shaped wiring region 32 are flushed or coplanar. Accordingly, the arithmetical mean roughness (Ra) of the top surface 41 of the insulating layer 4, the top surface 312 of the die bonding region 31, and the top surface 322 of the ring-shaped wiring region 32 is smaller than or equal to 1 μm, and the ten-point mean roughness (Rz) of the top surface 41 of the insulating layer 4, the top surface 312 of the die bonding region 31, and the top surface 322 of the ring-shaped wiring region 32 is smaller than or equal to 5 μm. Thus, the combination strength between the top surface 312 of the die bonding region 31 and the bottom surface of the reflecting layer 5 can be effectively increased by roughening the top surface of the die bonding region 31 to become rougher after the polishing process.

In step S170, as shown in FIG. 4B, the reflecting layer 5 is formed on the top surface 312 of the die bonding region 31 and covers part of the top surface 41 of the insulating layer 4 by photolithography or the screen printing, so that the die bonding region 31 is arranged in a reflecting region defined by orthogonally projecting the reflecting layer 5 onto the substrate 1. Thus, a portion of the top surface of the reflecting layer 5, which is arranged above the top surface 312 of the die bonding region 31, is formed as the flat surface 51 and is substantially parallel to the top surface 312 of the die bonding region 31. A portion of the top surface of the reflecting layer 5, which is arranged above the insulating layer 4, is formed as the curved surface 52 and surrounds the flat surface 51.

After implementing the steps S110 to S170, the LED carrier 100 is formed as shown in FIG. 4B. Optionally, each step can be replaced by an alternative state. For example, please refer to FIG. 6, which shows an alternative step S130' and an alternative step S170' respectively replacing the step S130 and the step S170, or referring to FIG. 7, which shows an alternative step S130" and an alternative step S170" respectively replacing the step S130 and the step S170 while omitting the step S150.

Figure 6:
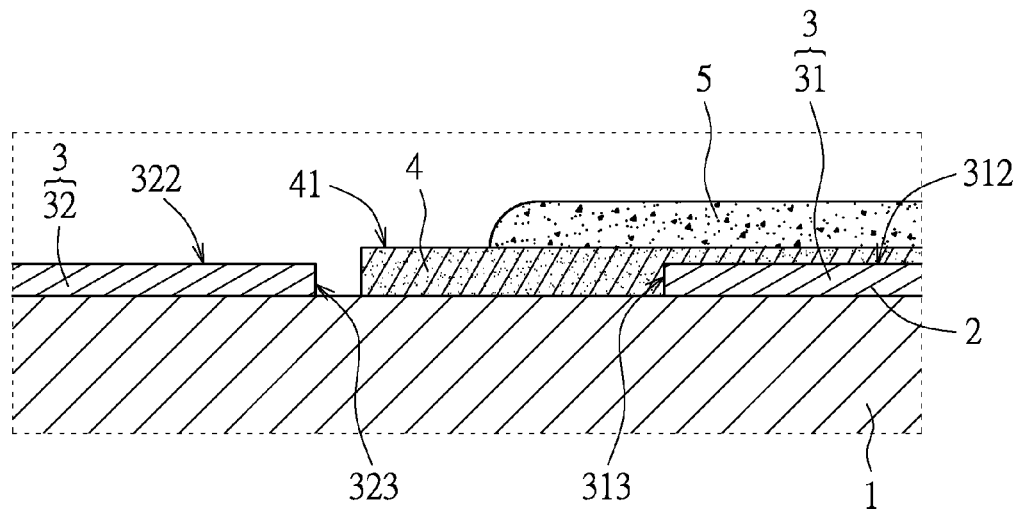
FIG. 6 is a cross-sectional view showing an alternative state of the first embodiment of the instant disclosure.
Figure 7:
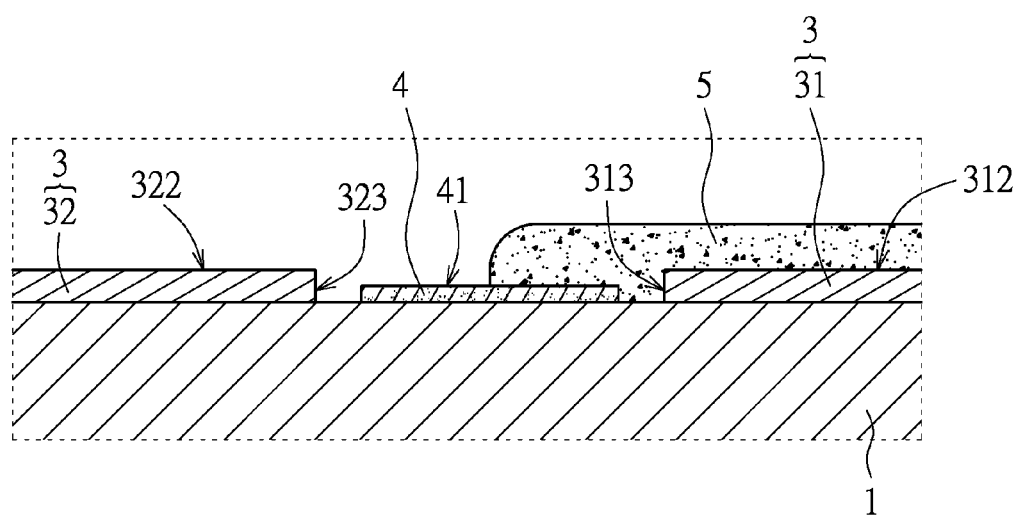
FIG. 7 is a cross-sectional view showing another alternative state of the first embodiment of the instant disclosure.
Figure 8:
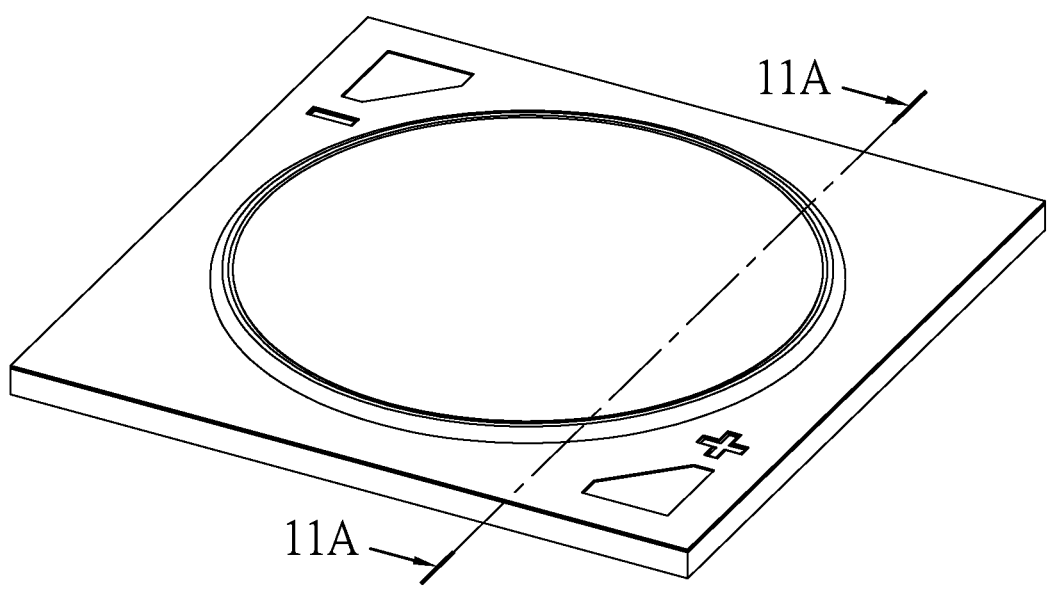
FIG. 8 is a perspective view showing the LED package structure according to a second embodiment of the instant disclosure.

The following description discloses the different manufacturing features of the alternative states as shown in FIGS. 6 and 7 with respect to the steps shown in FIG. 4B, and the structural features similar to the manufacturing features are not disclosed again.

Please refer to FIG. 6, which shows a first alternative state. In step S130', the top surface 41 of the insulating layer 4 is protruded from the top surface 312 of the die bonding region 31 and the top surface 322 of the ring-shaped wiring region 32 during the forming process of the insulating layer 4, so that the top surface 41 of the insulating layer 4 covers the entire top surface 312 and the entire side wall 313 of the die bonding region 31 (e.g., a gap exists between the insulating layer 4 and the side wall 323 of the ring-shaped wiring region 32), thereby the die bonding region 31 is embedded in the insulating layer 4. In other words, a projecting area of the insulating layer 4 defined by orthogonally projecting the insulating layer 4 onto the substrate 1 is greater than a projecting area of the die bonding region 31 defined by orthogonally projecting the die bonding region 31 onto the substrate 1. A thickness of the insulating layer 4, which covers the top surface 312 of the die bonding region 31, is 50% smaller than that of the die bonding region 31. In step S170', the reflecting layer 5 covers most of the top surface 41 of the insulating layer 4 during the forming process of the reflecting layer 5, so that the die bonding region 31 is arranged within the reflecting region defined by orthogonally projecting the reflecting layer 5 onto the substrate 1. In other words, a projecting area of the reflecting layer 5 defined by orthogonally projecting the reflecting layer 5 onto the substrate 1 is greater than the projecting area of the die bonding region 31 defined by orthogonally projecting the die bonding region 31 onto the substrate 1 (e.g., the outer periphery of the insulating layer 4 arranged above the insulating region 2 is not covered by the reflecting layer 5).

Please refer to FIG. 7, which shows a second alternative state. In step S130", the top surface 41 of the insulating layer 4 is lower than the top surface 312 of the die bonding region 31 and the top surface 323 of the ring-shaped wiring region 32 during the forming process of the insulating layer 4, so that a gap is formed between the insulating layer 4 and the side wall 313 of the die bonding region 31 and a gap is formed between the insulating layer 4 and the side wall 323 of the ring-shaped wiring region 32. In step S170", the reflecting layer 5 is formed on the top surface 312 of the die bonding region 31, covers part of the top surface 41 of the insulating layer 4, and is fully filled in the gap formed between the insulating layer 4 and the side wall 313 of the die bonding region 31 during the forming process of the reflecting layer 5, such that the die bonding region 31 is embedded in the reflecting layer 5.

Notably, the above steps are disclosed based on cross-sectional view, so that the instant disclosure can be carried out in another layout when satisfying the above steps. That is to say, in top view of the LED carrier 100, the LED carrier 100 can be provided with different layouts. Moreover, the order of each step for the instant embodiment can be changed in reasonable condition, in other words, the instant embodiment is not limited to the orders of the above steps.

The following description discloses the relationships of the LED dies 200, the reflecting frame 300, the encapsulation body 400, and the LED carrier 100 shown in FIGS. 1A through 2A as an example (please also refer to FIGS. 4A and 4B).

After the step of mounting the LED dies 200 on the LED carrier 100, the reflecting frame 300 and the encapsulation body 400 are formed in sequence on the LED carrier 100. Each of the LED dies 200 has a positive soldering pad and a negative soldering pad (not shown), both are mounted on the flat surface 51 of the reflecting layer 5. The LED dies 200 are electrically connected to the ring-shaped wiring region 32 of the metallic layer 3 (i.e., the positive electrode circuit 32P and the negative electrode circuit 32N) via a plurality of wires (not shown) in series. Specifically, since the flat surface 51 of the reflecting layer 5 is higher than the ring-shaped wiring region 32 of the metallic layer 3, the light emitted from the LED dies 200 disposed on the flat surface 51 of the reflecting layer 5 is not shielded by the ring-shaped wiring region 32 so as to prevent brightness loss, thus the LED package structure of the instant embodiment has preferably high brightness.

Figure 1A:
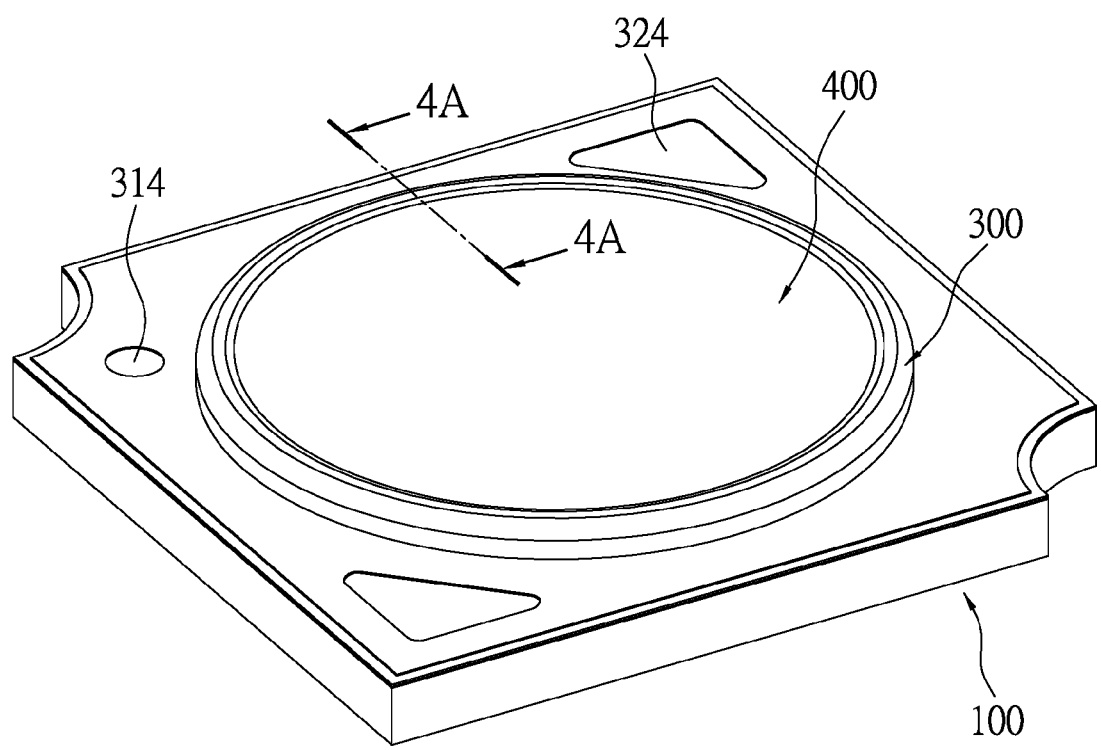
FIG. 1A is a perspective view showing an LED package structure according to a first embodiment of the instant disclosure.
Figure 1B:
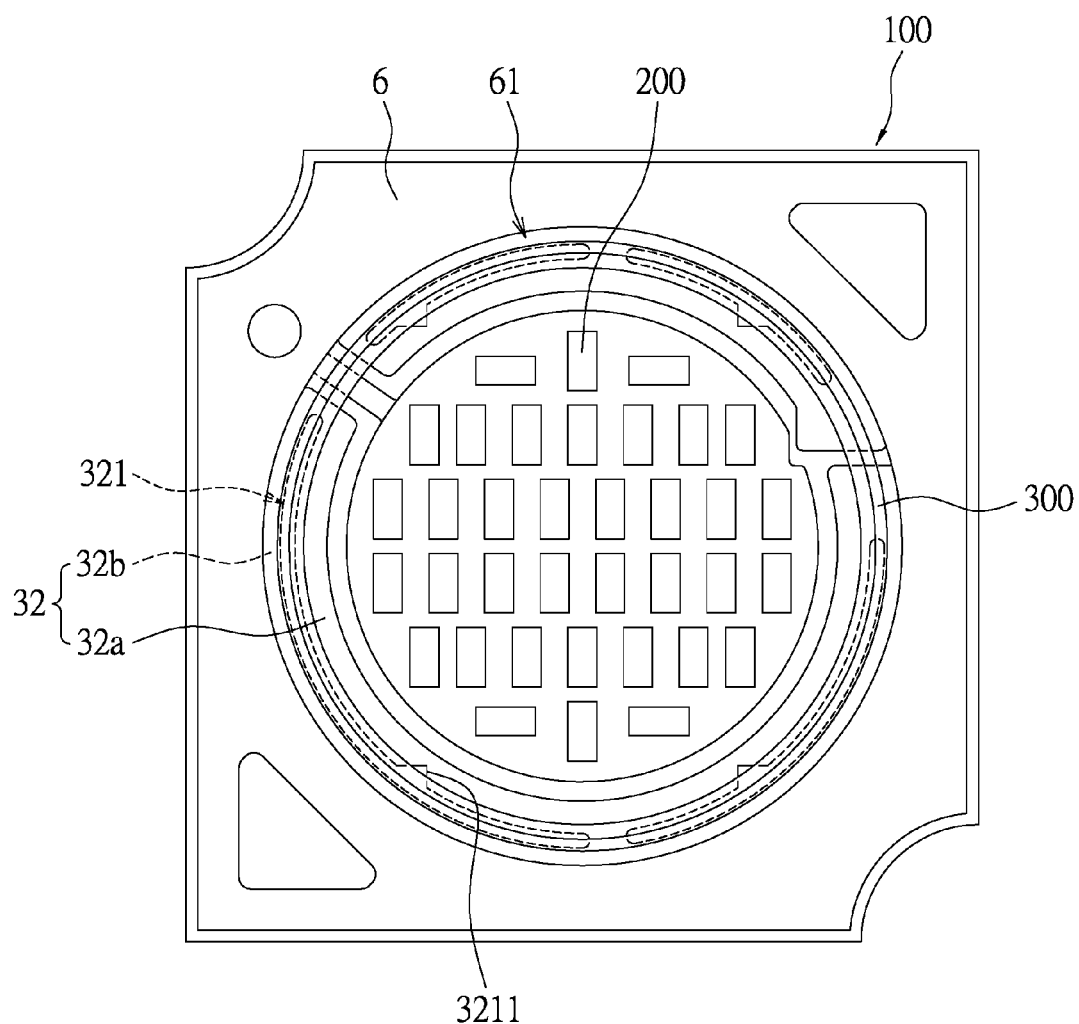
FIG. 1B is a top view of FIG. 1A as an encapsulation body is omitted.

Moreover, the reflecting frame 300 is disposed on the LED carrier 100 and surrounds the LED dies 200, and the encapsulation body 400 is arranged inside the reflecting frame 300 and covers the LED dies 200. The reflecting frame 300 can be disposed on the LED carrier 100 by a dispensing manner or a molding manner in order to receive the encapsulation body 400. Specifically, the reflecting frame 300 is formed on the ring-shaped wiring portion 32 of the metallic layer 3, where the ring-shaped wiring portion 32 is not covered by the solder-resist layer 6. In other words, the outer edge of the reflecting frame 300 overlaps the edge of the opening 61 of the solder-resist layer 6, the reflecting frame 300 covers the arc slots 321 except for the V-shaped notches 3211 (as shown in FIG. 1B). The arrangement of the arc slots 321 increases the combination strength between the reflecting frame 300 and the substrate 1. The encapsulation body 400 is limited in a packaging region defined by the reflecting frame 300, such that the packaging region and the amount of resin for the encapsulation body 400 can be effectively controlled.

The reflecting frame 300 and the encapsulation body 400 can be made by silicone resin or epoxy resin. For example, the reflecting frame 300 can be a non-transparent frame for reflecting light emitted from the LED dies 200, and the encapsulation body 400 can be a transparent body or a fluorescent body having fluorescent powders, but the instant embodiment is not limited to the examples provided herein.

Specifically, when the reflecting frame 300 is disposed on the LED carrier 100 to surround the LED dies 200, the reflecting frame 300 is only disposed on the connecting boundary of the solder-resist layer 6 and the ring-shaped wiring region 32 of the metallic layer 3 (as shown in FIG. 1B). The contacting area between the reflecting frame 300 and the ring-shaped wiring region 32 of the metallic layer 3 can be increased by the slots 321 of the ring-shaped wiring region 32 being exposed from the solder-resist layer 6, so that the combination strength between reflecting frame 300 and the ring-shaped wiring region 32 is increased. Thus, the instant embodiment can effectively avoid the reflecting frame 300 being peeled from the ring-shaped wiring region 32 due to an external force. Moreover, the reflecting frame 300 does not entirely cover the ring-shaped wiring region 32. A portion of the ring-shaped wiring region 32, which is not covered by the ring-shaped wiring region 32, is configured to be a wiring region for the wiring process of the LED dies 200.

Specifically, the ring-shaped wiring region 32 can be divided into an inner arc circuit 32a and an outer arc circuit 32b (as shown in FIG. 1B) by forming the arc slots 321. The outer arc circuit 32b is covered by the reflecting frame 300, and the inner arc circuit 32a is exposed from the reflecting frame 300 for providing the wiring process of the LED dies 200.

Besides, the LED package structure can be provided without the reflecting frame 300 (not shown), that is to say, the encapsulation body 400 is directly formed on the LED carrier 100 to cover the LED dies 200, thereby directly encapsulating the LED dies 200.

Second Embodiment

Please refer to FIGS. 8 through 11B, which show a second embodiment of the LED package structure. The second embodiment is similar to the first embodiment, but the reflecting layer 5 of the instant embodiment is also used as the solder-resist layer. The design principle of the LED carrier 100 of the instant embodiment is similar to the first embodiment, but some structural features of the instant embodiment are different from the first embodiment and discloses as follows.

Figure 9:
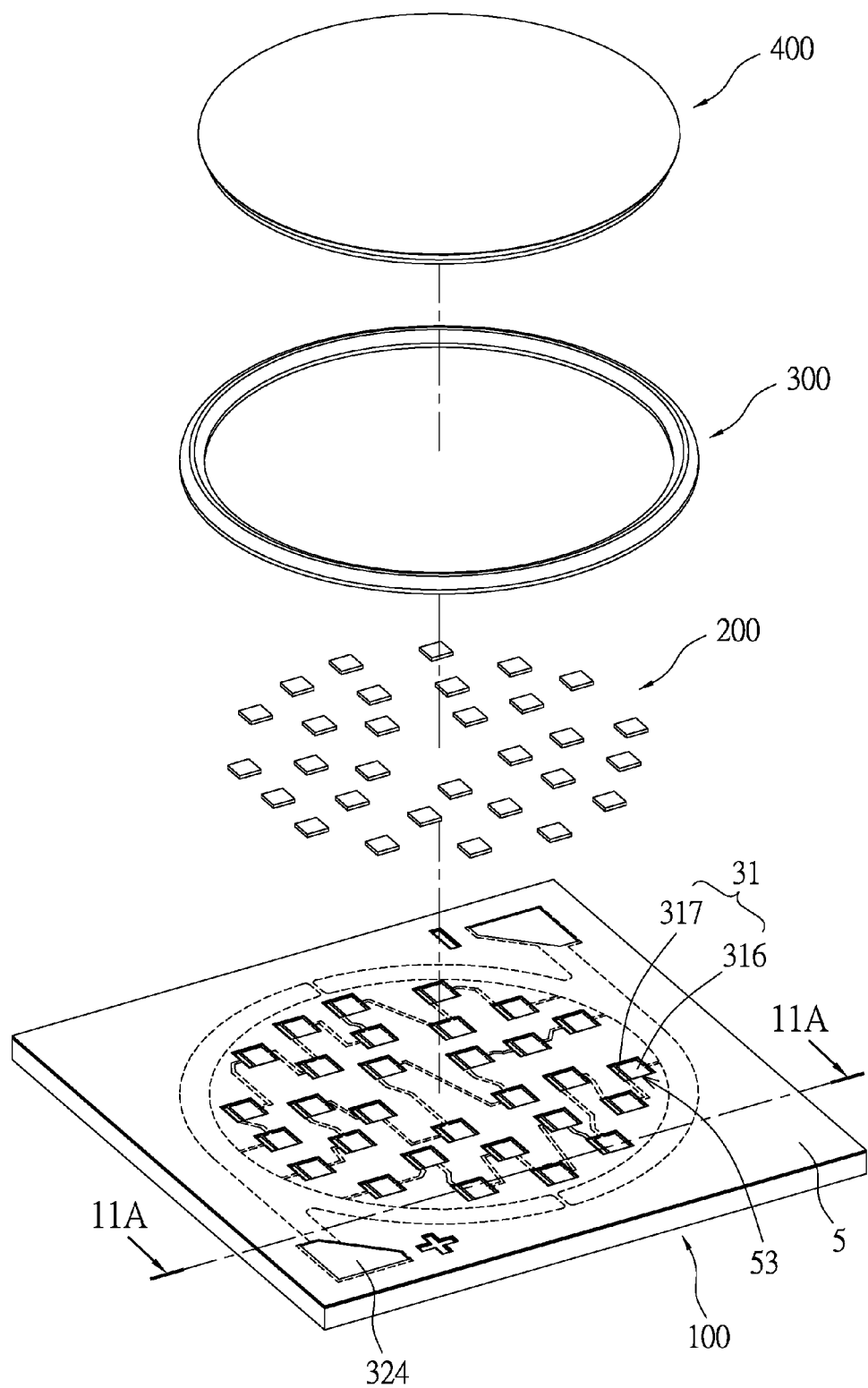
FIG. 9 is an exploded view of FIG. 8.
Figure 10:
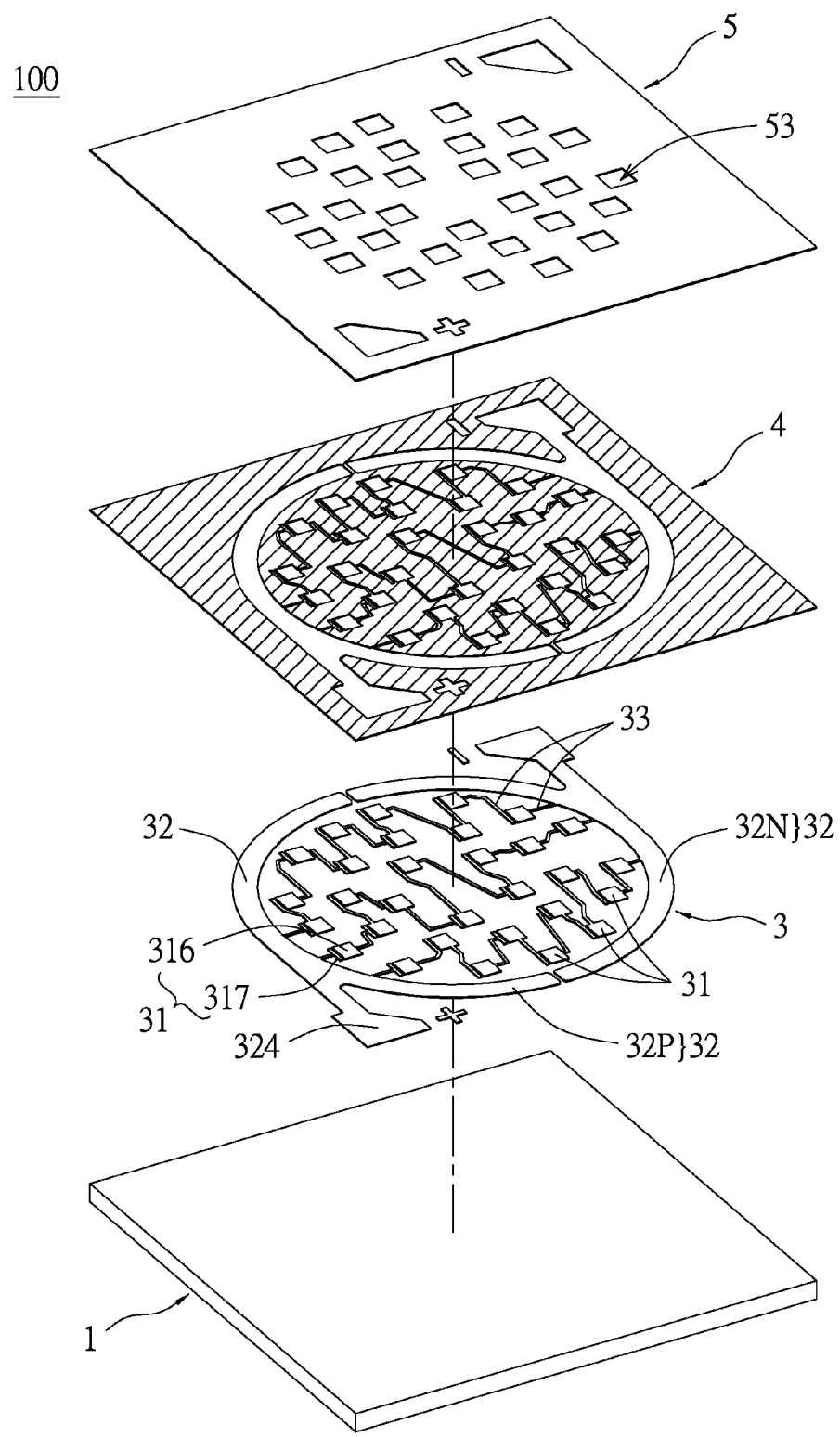
FIG. 10 is an exploded view showing the LED carrier of FIG. 9.

As shown in FIGS. 9 and 10, the metallic layer 3 has a first pattern, and the first pattern includes a plurality of die bonding regions 31, a ring-shaped wiring region 32, and a plurality of connectors 33. Each of the die bonding regions 31 has a first die bonding portion 316 and a second die bonding portion 317 arranged apart from the first die bonding portion 316. An LED die 200, which is a flip-chip die, is disposed on the first die bonding portion 316 and the second die bonding portion 317 by a flip-chip manner. The ring-shaped wiring region 32 has a positive electrode circuit 32P and a negative electrode circuit 32N arranged apart from the positive electrode circuit 32P. The die bonding regions 31 and the connectors 33 are surrounded by the ring-shaped wiring region 32. The connectors 33 connect the plurality of die bonding regions 31 to the ring-shaped wiring region 32. Specifically, any one of the die bonding region 31 is arranged between two adjacent connectors 33, such that the die bonding regions 31 and the connectors 33 are arranged in a continuous line in an alternative manner. The connectors 33 arranged at two opposite ends are respectively connected to the two portions of the ring-shaped wiring region 32 (i.e., the positive electrode circuit 32P and the negative electrode circuit 32N). Moreover, the ring-shaped wiring region 32 of the instant embodiment is provided without any slot 321.

Each of the die bonding regions is provided for mounting one LED die 200, and the die bonding regions 31 are arranged substantially inside the ring-shaped wiring region 32 in three concentric circles to provide an LED package structure having uniformly light-emitting effect.

The metal layer 3 has a first pattern and the insulating layer 4 has a second pattern, while the first pattern and the second pattern are complementary. Namely, the insulating layer 4 is disposed on an insulating region of the substrate 1. The insulating region can be defined by a region that is not covered by the metallic layer 3. The edge of the insulating layer 4 substantially aligns the edge of the substrate 1. The top surface of the metallic layer 3 and the top surface of the insulating layer 4 are coplanar. Moreover, the reflecting layer 5 covers the metallic layer 3 and the insulating layer 4. The reflecting layer 5 has a plurality of openings 53, such that the die bonding regions 31 are exposed from the reflecting layer 5 via the openings 53. The edge of the reflecting layer 5 substantially is flushed against the edge of the substrate 1 and the edge of the insulating layer 4.

Additionally, in another embodiment (not shown), the reflecting layer 5 can be only disposed inside the ring-shaped wiring region 32, the edge of the reflecting layer 5 does not need to be aligned or flushed against the edge of the substrate 1 before disposing the solder-resist layer 6 of the first embodiment on the reflecting layer 5. In other words, the reflecting layer 5 is disposed on the circular region that the LED dies 200 are mounted thereon. Thus, the usage of the reflecting material can be reduced for cost down by reducing the covering area of the reflecting layer 5.

Figure 11A:
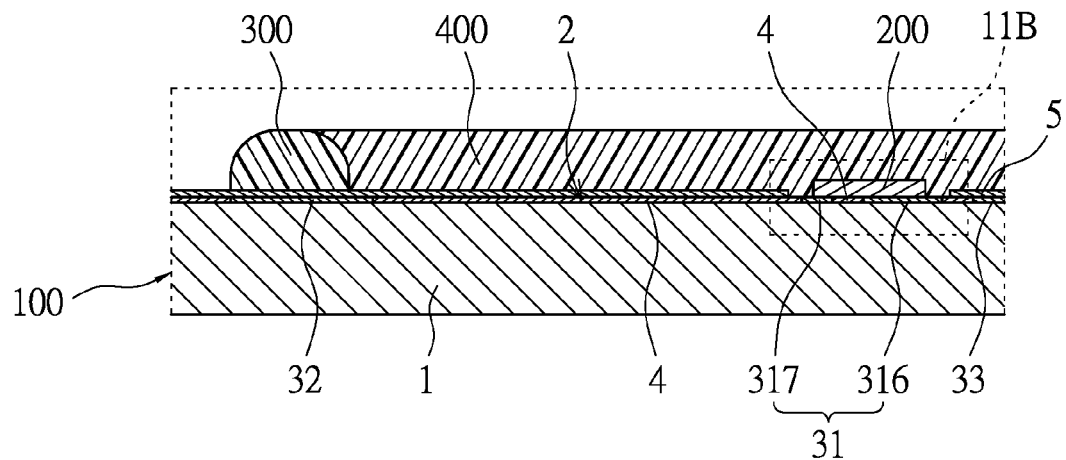
FIG. 11A is a cross-sectional view of FIG. 8 along line 11A-11A.
Figure 11B:
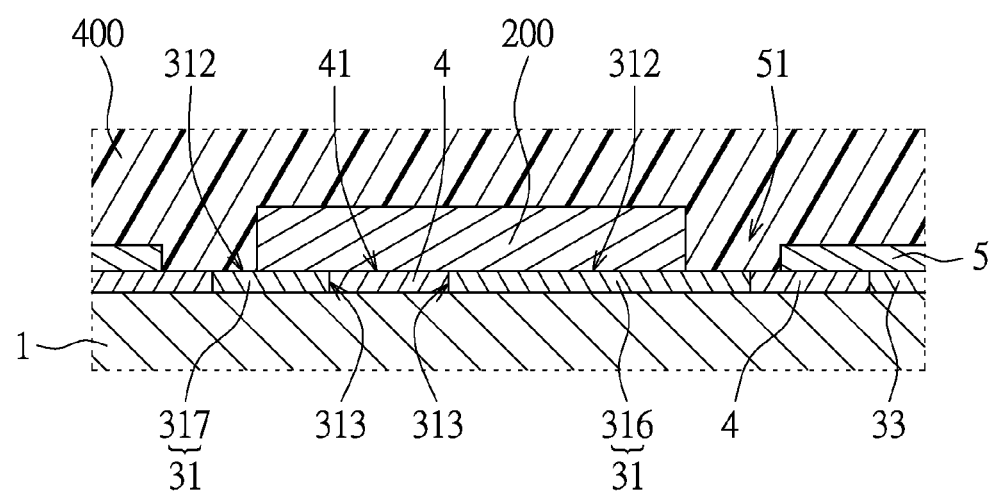
FIG. 11B is an enlarged view showing the region 11B of FIG. 11A.

Specifically, please refer to FIGS. 11A and 11B. Each of the die bonding regions 31 has the first die bonding portion 316 and the second die bonding portion 317. The LED die 200, which is a flip-chip die, is disposed across the first die bonding portion 316 and the second die bonding portion 317. The LED die 200 is also arranged across the insulating region 2 between the first die bonding portion 316 and the second die bonding portion 317. A region between the side wall 313 of the die bonding regions 31 and the side wall 323 of the ring-shaped wiring region 32 is defined as the insulating region 2. A region between the side walls 313 of the first die bonding portion 316 and the second die bonding portion 317 is also defined as the insulating region 2. The insulating layer 4 is filled in the insulating region 2 to cover the side wall 313 of the die bonding regions 31 and the side wall 323 of the ring-shaped wiring region 32. Moreover, the top surface 41 of the insulating layer 4, the top surface 312 of the die bonding regions 31, and the top surface 322 of the ring-shaped wiring region 3 are substantially coplanar. In other words, the metallic layer 3 has a first pattern, the insulating layer 4 has a second pattern, the first pattern and the second pattern are complementary, and the metallic layer 3 is coplanar with the insulating layer 4, such that the insulating layer 4 covers the side edge of the die bonding regions 31, the side edge of the ring-shaped wiring region 32, and the side edge of each connectors 33.

Please refer to FIGS. 8, 9, 11A, and 11B. After mounting the LED dies 200 on the LED carrier 100, the reflecting frame 300 and the encapsulation body 400 are sequentially disposed on the LED carrier 100 to obtain an LED package structure. The LED dies 200 are respectively mounted on the die bonding regions 31 via the openings 53 of the reflecting layer 5, so that the LED dies 200 are respectively and electrically connected in series by the continuous lines defined by the die bonding regions 31 and the connectors 33. It should be noted that, the reflecting frame 300 can be formed firstly, and then the LED dies 200 is mounted. That is to say, the reflecting frame 300, the LED dies 200, and the encapsulation body 400 can be disposed on the LED carrier 100 in sequence.

Moreover, the reflecting frame 300 is disposed on the reflecting layer 5 and surrounds the LED dies 200, and the encapsulation body 400 is arranged within the reflecting frame 300 and covers the LED dies 200. The reflecting frame 300 can be disposed on the LED carrier 100 by a dispensing manner or a molding manner in order to receive the encapsulation body 400.

Additionally, the substrate 1 of the instant embodiment can be a metallic substrate or an insulating substrate. When the substrate 1 is the metallic substrate, a dielectric layer (not shown) is disposed between the metallic substrate and the metallic layer 3, the dielectric layer covers one surface of the metallic substrate, and the edge of the dielectric layer substantially aligns with or is flushed against the edge of the metallic substrate. The metallic substrate can be an aluminum substrate or a copper substrate, but is not limited thereto. The insulating substrate can be a ceramic substrate or a resin substrate.

Third Embodiment

Figure 12A:
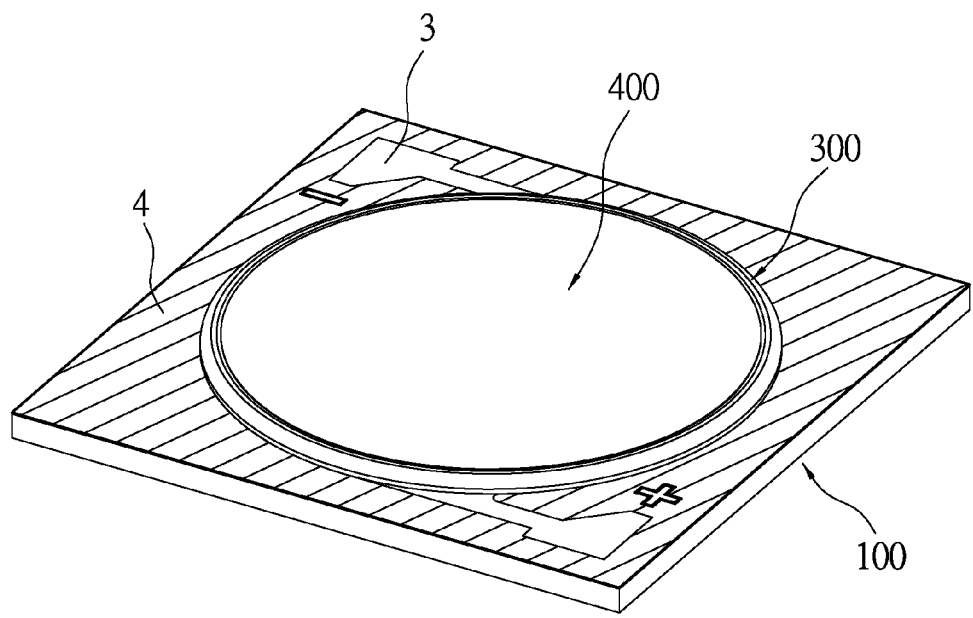
FIG. 12A is a perspective view showing the LED package structure according to a third embodiment of the instant disclosure.
Figure 12B:
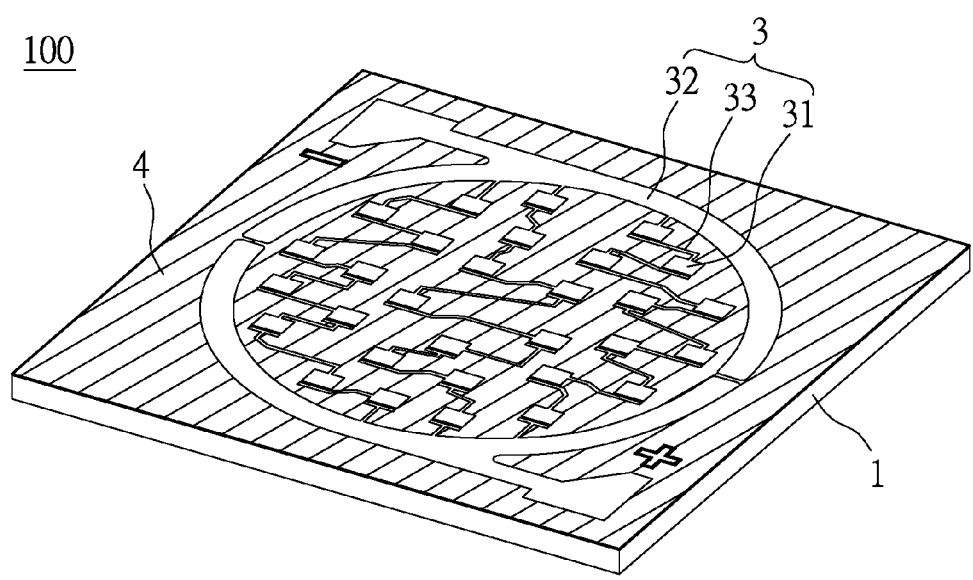
FIG. 12B is a perspective view showing the LED carrier of FIG. 12A.

Please refer to FIGS. 12A and 12B, which show a state of a third embodiment of the LED package structure of the instant disclosure. The LED package structure includes an LED carrier 100, a plurality of LED dies 200, a reflecting frame 300, and an encapsulation body 400. The LED carrier 100 includes a substrate 1, a metallic layer 3, and an insulating layer 4. The metallic layer 3 and the insulating layer 4 are disposed on the substrate 1. The metallic layer 3 has a first pattern, the insulating layer 4 has a second pattern, and the first pattern and the second pattern are complementary. The main difference between the state of the third embodiment and the second embodiment is that the exclusion of the reflecting layer 5 in the LED carrier 100 of the instant state. The substrate 1 of the LED carrier 100 is an insulating substrate, such as a ceramic substrate or a resin substrate. In the instant state of the third embodiment, the LED carrier 100 is provided without the solder-resist layer, such that the upper surface of the LED package structure arranged outside the reflecting frame 300 is the insulating layer 4.

Figure 13A:
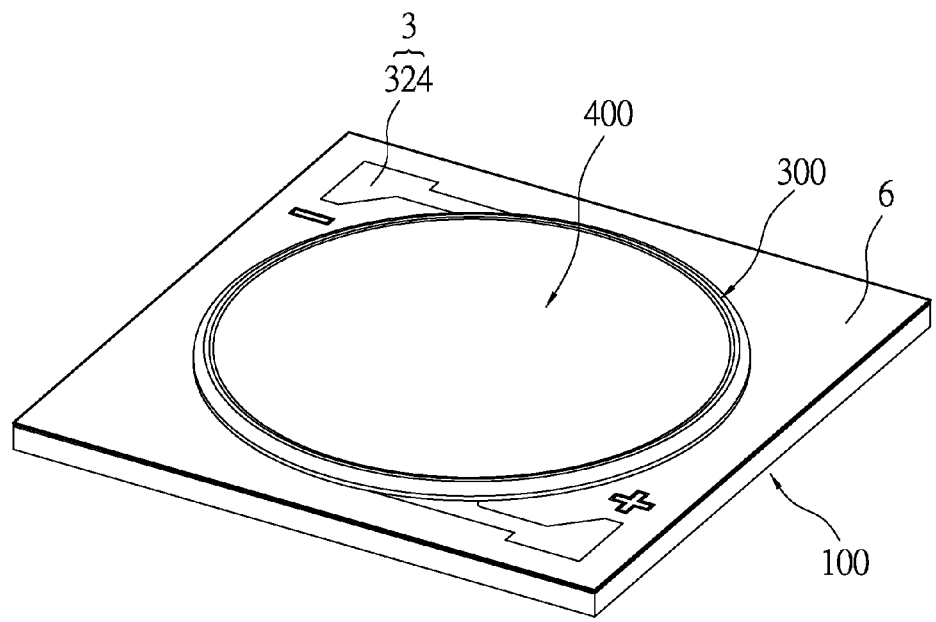
FIG. 13A is a perspective view showing an alternative state of the third embodiment of the instant disclosure.
Figure 13B:
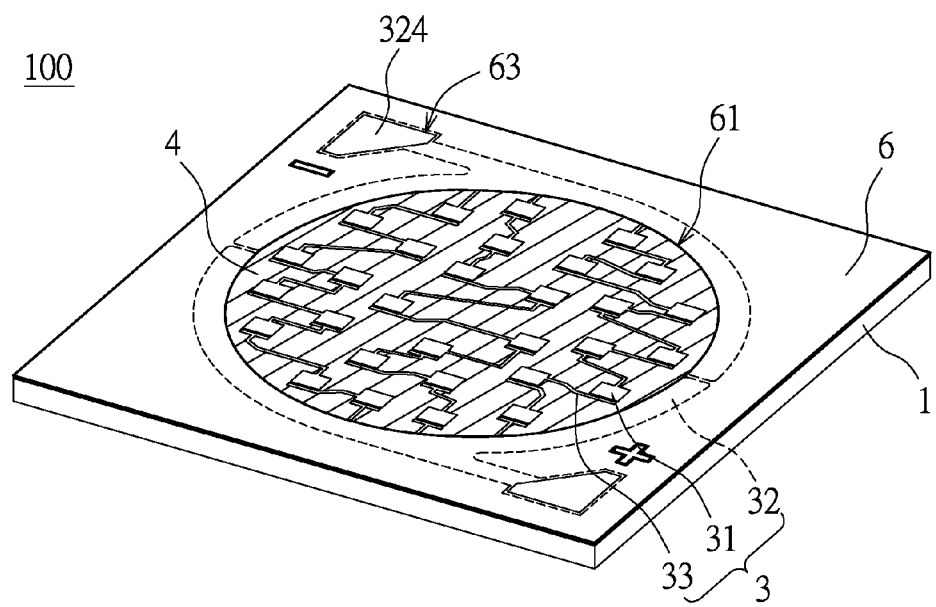
FIG. 13B is a perspective view showing the LED carrier of FIG. 13A.

Please refer to FIGS. 13A and 13B, which show another state of the LED package structure in accordance with the third embodiment of the instant disclosure. The LED package structure includes an LED carrier 100, a plurality of LED dies 200, a reflecting frame 300, and an encapsulation body 400. The LED carrier 100 includes a substrate 1, a metallic layer 3, an insulating layer 4, and a solder-resist layer 6. The metallic layer 3 and the insulating layer 4 are disposed on the substrate 1. The metallic layer 3 has a first pattern, the insulating layer 4 has a second pattern, and the first pattern and the second pattern are complementary. The solder-resist layer 6 is disposed on the metallic layer 3 and the insulating layer 4. The main difference between the state of the third embodiment and the second embodiment is the exclusion of the reflecting layer 5 in the LED carrier 100 of the instant state. The substrate 1 of the LED carrier 100 is a metallic substrate, and a dielectric layer is disposed between the metallic substrate and the metallic layer 3. The edge of the solder-resist layer 6 aligns with or is flushed against the edge of the insulating layer 4, and the solder-resist layer 6 further has a circular opening 61 arranged on the center thereof and two triangular openings 63 arranged outside the opening 61. The edge of the opening 61 substantially aligns with the edge of the ring-shaped wiring region 32, the die bonding regions 31 and the connectors 33 are arranged in the opening 61, and the ring-shaped wiring region 32 is covered by the solder-resist layer 6. The positions of the two openings 63 respectively correspond to the soldering pads 324 of the ring-shaped wiring region 32, such that the soldering pads 324 are exposed from the solder-resist layer 6 via the openings 63 to establish connections to an external power.

Fourth Embodiment

Please refer to FIGS. 14 through 17B, which show a fourth embodiment of the instant disclosure. The design principle of the LED carrier 100 of the instant embodiment is similar to the second embodiment, and the construction of the LED package structure of the instant embodiment is substantially disclosed as follows.

Figure 14:
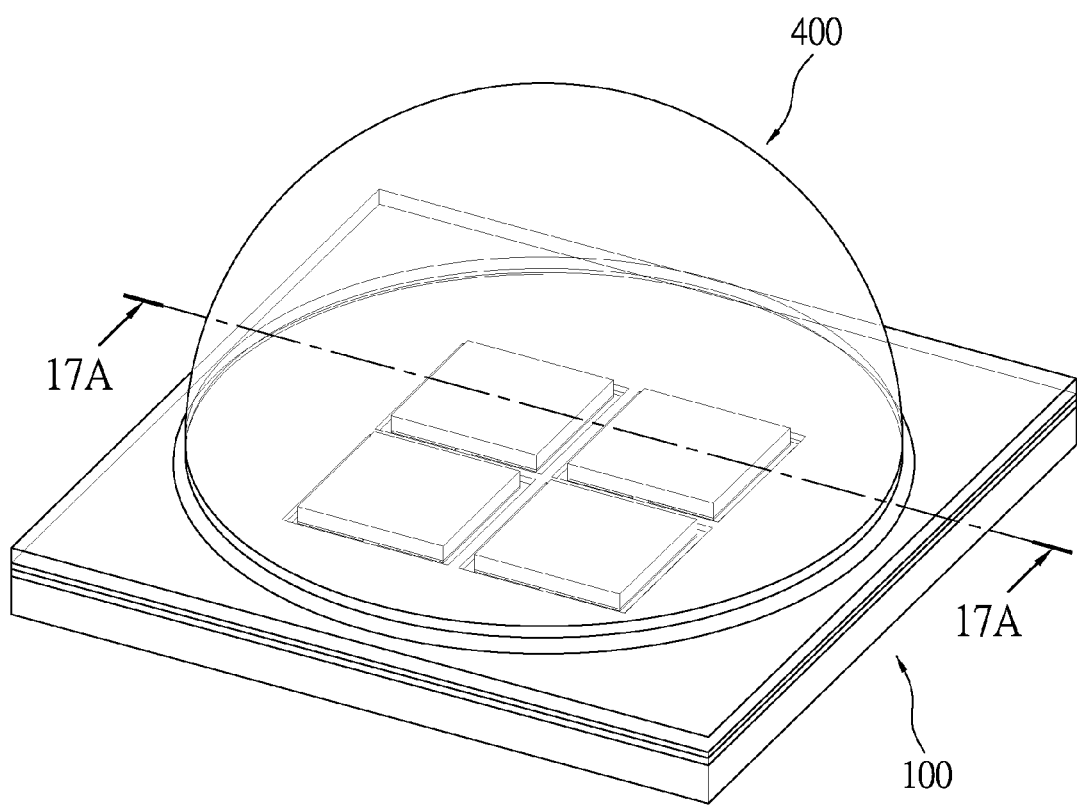
FIG. 14 is a perspective view showing the LED package structure according to a fourth embodiment of the instant disclosure.
Figure 15:
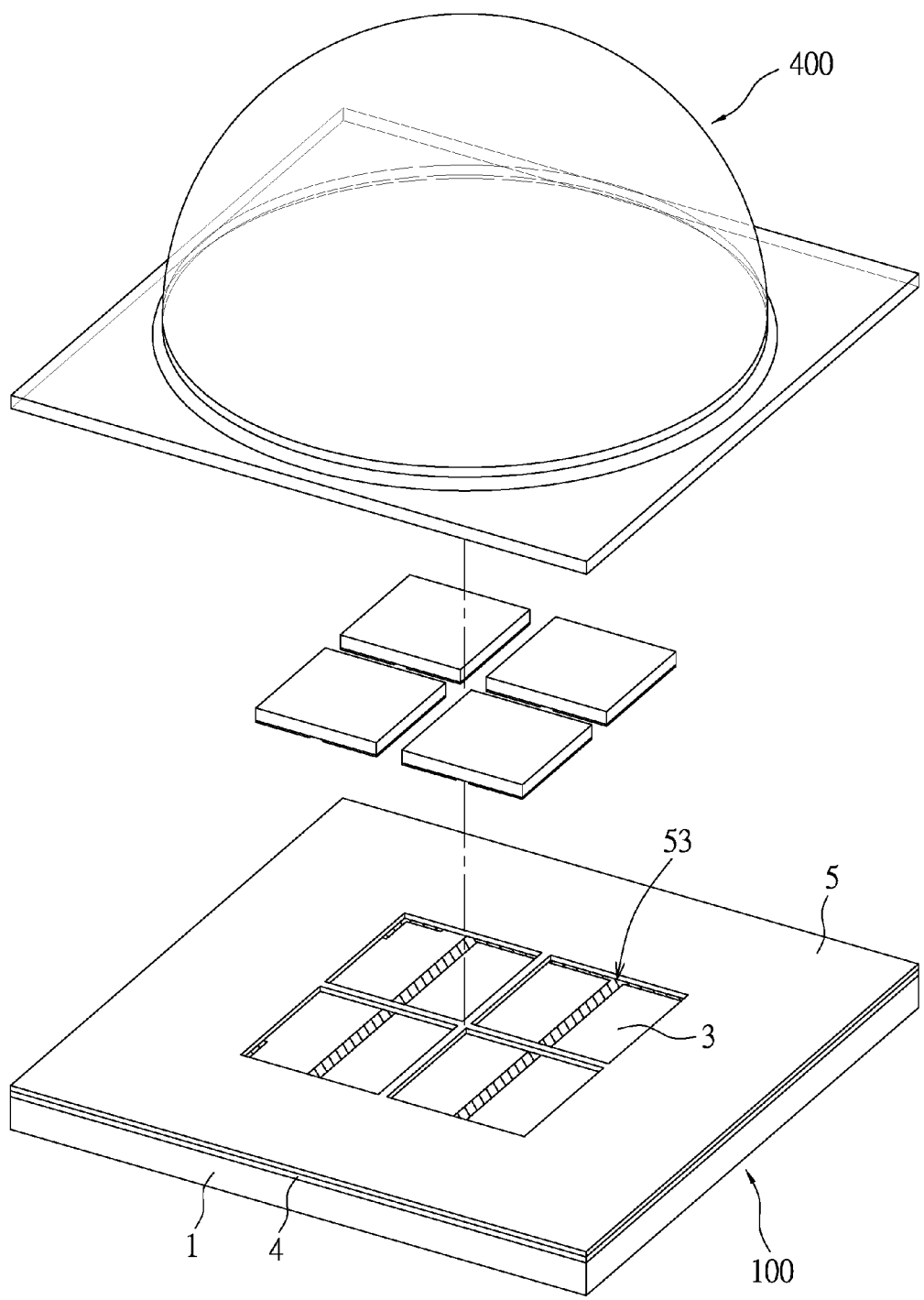
FIG. 15 is an exploded view of FIG. 14.

As shown in FIGS. 14 and 15, the LED package structure of the instant embodiment includes an LED carrier 100, a plurality of LED dies 200 mounted on the LED carrier 100, and an encapsulation body 400 formed on the LED carrier 100. The LED dies 200 are flip-chip dies, thus the LED dies 200 can be mounted on the LED carrier 100 directly without any gold wires. The encapsulation body 400 may be epoxy resin or silicon resin and may further include a fluorescent material mixed therein, thereby changing the color of light emitted from the LED package structure. When the fluorescent material is not mixed with the encapsulation body 400, the fluorescent material can be selectively coated on the LED dies 200 to change the color of light emitted from the LED dies 200. The following description discloses the LED carrier 100, and then discloses the relationship between the LED carrier 100 and the other components.

Figure 16:
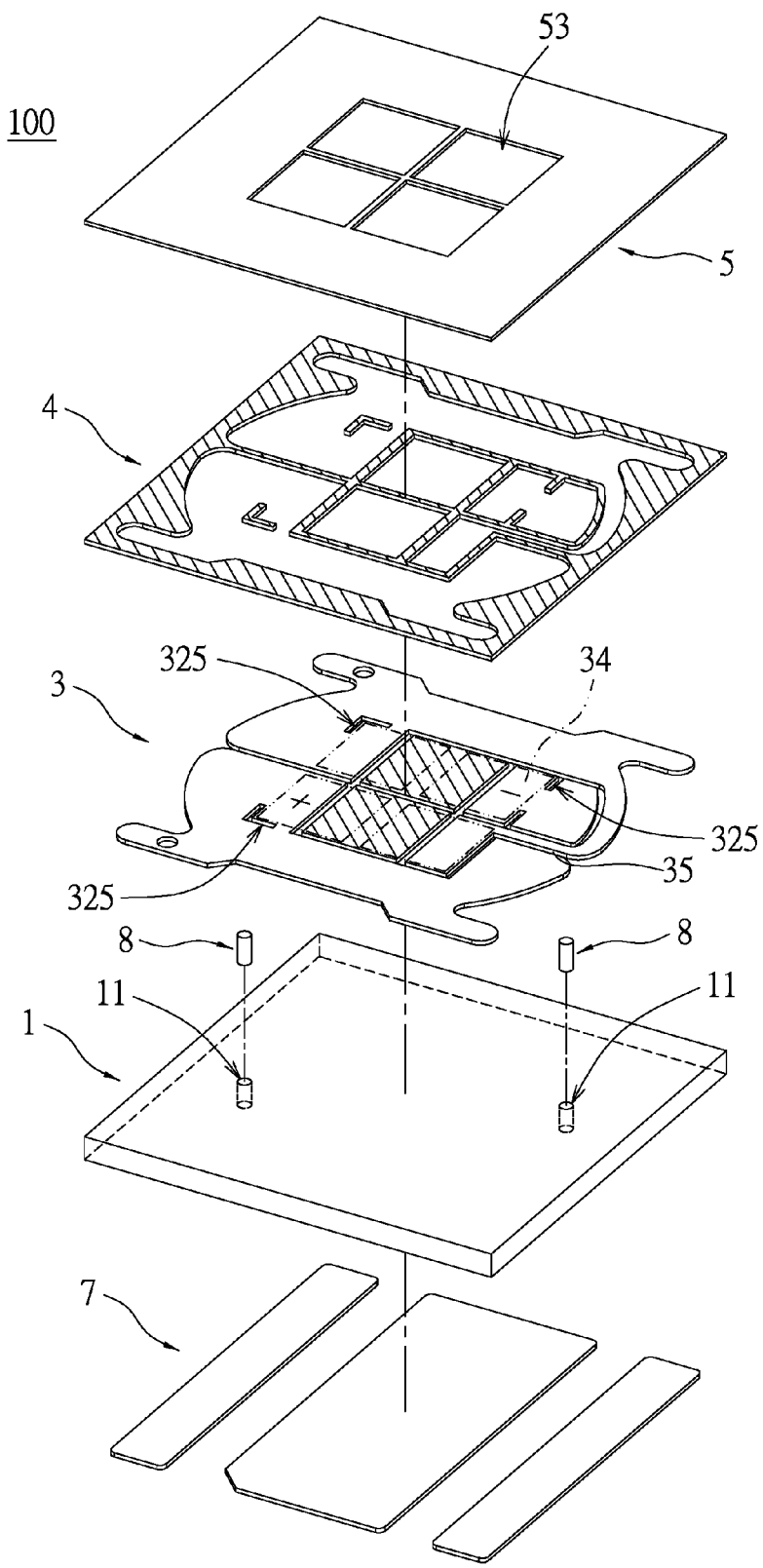
FIG. 16 is an exploded view showing the LED carrier of FIG. 15.

Please refer to FIG. 16. The LED carrier 100 includes a substrate 1, a metallic layer 3, an insulating layer 4, a reflecting layer 5, three soldering pads 7, and two conductive pillars 8. The substrate 1 of the instant embodiment is the insulating substrate, such as a ceramic substrate or a resin substrate.

The metallic layer 3 (e.g., copper foil) and the soldering pads 7 are respectively disposed on two opposite surfaces of the substrate 1 (i.e., the top surface and the bottom surface of the substrate 1 as shown in FIG. 16). The metallic layer 3 has a first pattern, and the first pattern has a plurality of blocks. For the purpose of that the LED dies 200 are connected in series, the blocks of the first pattern are staggered and spaced apart to define four die bonding areas 34 (as shown in FIG. 16). Two of the plurality of blocks, which are arranged at two ends of the series, are respectively used as a positive electrode and a negative electrode.

The substrate 1 further has at least two thru-holes. The two thru-holes 11 of the substrate 1 are provided for filling the conductive pillars 8 therein, so that the two conductive pillars 8 respectively connect the positive electrode and the negative electrode to the soldering pads 7 (i.e., the left side soldering pad 7 and the right side soldering pad 7 as shown in FIG. 16). The soldering pad 7 arranged on the center of the substrate 1 is used for dissipating heat. Thus, the electrical path and the heat dissipation path can be separated by those three soldering pads 7.

The insulating layer 4 is disposed on an insulating portion of the substrate 1 not covered by the metallic layer 3, a carrying region of the substrate 1 provided for carrying the metallic layer 3 and a carrying region of the substrate 1 provided for carrying the insulating layer 4 are complementary, and the edge of the insulating layer 4 substantially aligns with or is flushed against the edge of the substrate 1. In other words, the metallic layer 3 has a first pattern, the insulating layer 4 has a second pattern, and the first pattern and the second pattern are complementary. The metallic layer 3 and the insulating layer 4 are coplanar.

Moreover, the reflecting layer 5 covers the metallic layer 3 and the insulating layer 4 and has four openings 53, and the four die bonding areas 34 are exposed from the reflecting layer 5 respectively via the four openings 53. The edge of the reflecting layer 5 substantially aligns with or is flushed against the edge of the insulating layer 4. The light performance of the LED package structure can be increased by disposing the reflecting layer 5 around the LED dies 200.

Figure 17A:
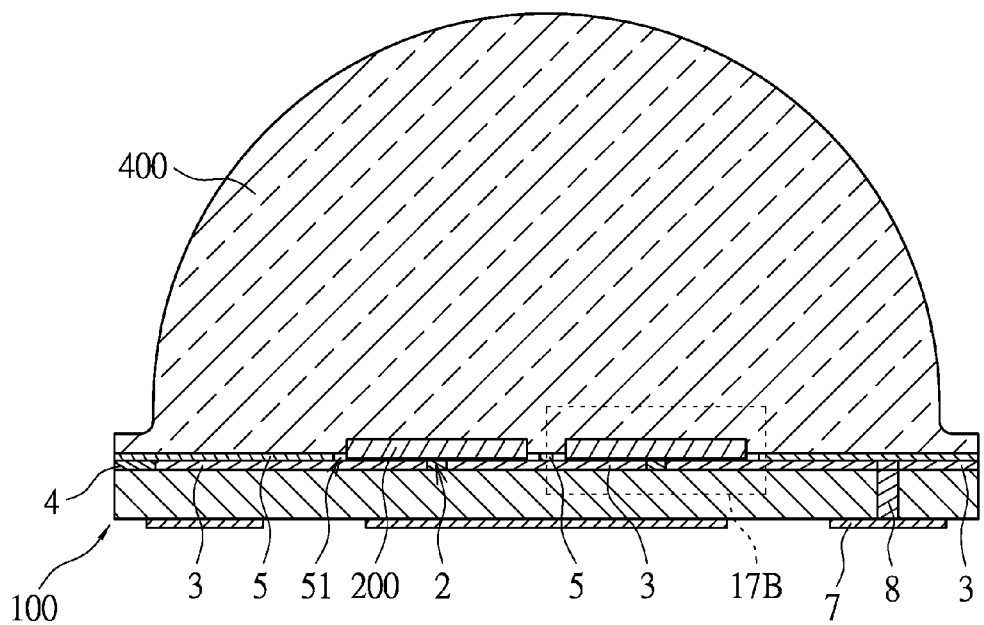
FIG. 17A is a cross-sectional view of FIG. 14 along line 17A-17A.
Figure 17B:
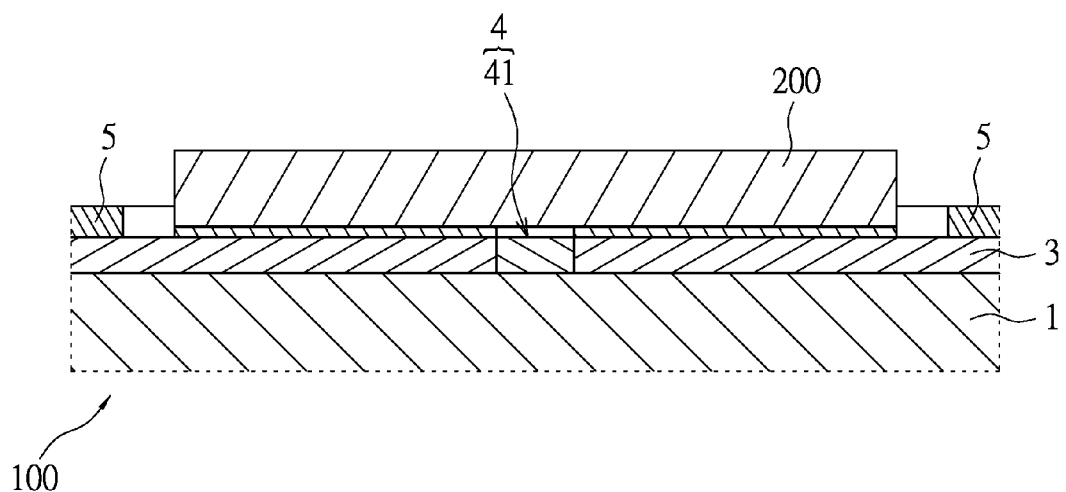
FIG. 17B is an enlarged view showing the region 17B of FIG. 17A.

Particularly, as shown in FIGS. 17A and 17B, a region arranged between two side walls of the two adjacent blocks of the metallic layer 3 is defined as the insulating region 2. The insulating layer 4 is filled in the insulating region 2 and covers the side walls of the two adjacent blocks of the metallic layer 3, and the top surface 41 of the insulating layer 4 and the top surface of the metallic layer 3 are coplanar. By adapting the flip-chip die, the flip-chip die is arranged across the insulating region 2 to dispose on the metallic layer 3. However, since the electrodes of the flip-chip die are arranged very close to one another, the positive electrode and the negative electrode of the metallic layer 3 are also closely arranged, which easily renders the LED package structure unreliable. The instant embodiment sets the insulating layer 4 in the insulating region 2 to ensure that the positive electrode and the negative electrode of the metallic layer 3 are separated with a distance, thereby increasing the reliability of the LED package structure.

As shown in FIGS. 14, 15, 17A, and 17B, the reflecting layer 5 surrounds the die bonding areas 34 while covering the metallic layer 3 and the insulating layer 4. That is to say, the reflecting layer 5 is not arranged under the LED dies 200, the reflecting layer 5 is disposed on the metallic layer 3 and the insulating layer 4, and reflecting layer 5 surrounds the LED dies 200.

Please refer to FIGS. 15 and 16. The LED dies 200 are bonded on the LED carrier 100, and the encapsulation body 400 is formed on the LED carrier 100, thereby forming the LED package structure. The edge of the encapsulation body 400 substantially aligns with the edge of the reflecting layer 5, and the center portion of the encapsulation body 400 is substantially constructed as a hemisphere lens. Each of the LED dies 200 is fixed on the respective die bonding area 31 of the metallic layer 3 and across the insulating region 2 by passing through the respective opening 53 of the reflecting layer 5, thereby the LED dies 200 can be electrically connected in a series manner with high reliability.

As shown in FIG. 16, one of the two outer blocks of the metallic layer 3 has a tail 35, and the tail 35 extends around the negative block to enter the another outer block, thereby the LED dies 200 can be conducted in series. That is to say, the four LED dies 200 are electrically connected in series. Moreover, the negative block surrounded by the tail 35 has two straight slits 325, and each of the two outer blocks has a hollow right angle slit 325 arranged on the left portion thereof as shown in FIG. 16. The two straight slits 325 and the two right angle slits 325 are provided for the locations of the LED dies 200.

Fifth Embodiment

Figure 18:
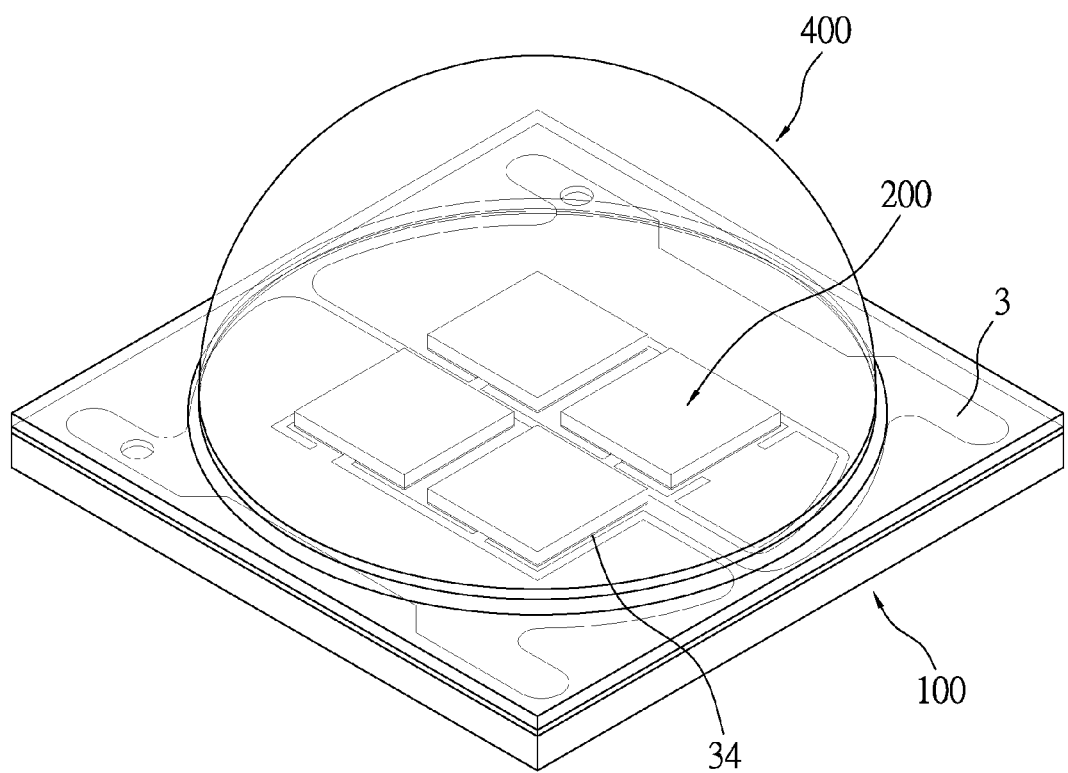
FIG. 18 is a perspective view showing the LED package structure according to a fifth embodiment of the instant disclosure.

Please refer to FIG. 18, which shows a fifth embodiment of the LED package structure of the instant disclosure. The LED package structure includes an LED carrier 100, a plurality of LED dies 200, and an encapsulation body 400. The design principle of the LED carrier 100 of the instant embodiment is similar to the fourth embodiment. The LED carrier 100 of the instant embodiment includes a substrate 1, a metallic layer 3, and an insulating layer 4. The metallic layer 3 and the insulating layer 4 are disposed on the substrate 1. The metallic layer 3 has a first pattern, the insulating layer 4 has a second pattern, and the first pattern and the second pattern are complementary. The difference between the instant embodiment and the fourth embodiment is disclosed as follows. The LED carrier 100 is provided without the reflecting layer 5 of the fourth embodiment. Each LED die 200 is directly fixed on the respective die bonding area 34 of the metallic layer 3. The encapsulation body 400 having lens construction is directly formed on the LED carrier 100, and the edge of the encapsulation body 400 aligns with the edge of the LED carrier 100.

[The Possible Effect of the Instant Disclosure]

In summary, the LED package structure of the first embodiment of the instant disclosure is provided with the insulating layer and the reflecting layer of the LED carrier and formed by two steps, such that when forming the reflecting layer, the sagging phenomenon of returning ink remain is usually happened on the curved surface of the insulating layer so that the die bonding areas is enough to optimize the distance between each of the LED dies. The LED package structure of the instant disclosure can effectively provide high lighting performance.

When the insulating layer (or the reflecting layer) is formed and entirely covers the side wall of the die bonding region, the side wall of the die bonding region is not exposed to air and the side wall of the die bonding region is prevented from being oxidized. Therefore, the degradation of light output generated from the residual etching agent is avoided. Moreover, the combination strength between the top surface of the metallic layer and the bottom surface of the reflecting layer can be effectively increased by roughening the top surface of the metallic layer.

Additionally, the LED package structure according to the second to the fifth embodiments of the instant disclosure can prevent ions from migrating. The ions migration is usually happened due to the distance between the first die bonding portion and the second die bonding portion too short. By means of the metallic layer and the insulating layer are coplanar and the first pattern and the second pattern are complementary, the reliability of the LED package structure is enhanced.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A manufacturing method of an LED carrier, comprising:
   providing a substrate;
   forming a metallic layer having a first pattern on the substrate; and
   forming an insulating layer having a second pattern on the substrate, wherein the second pattern is entirely complementary to the first pattern, and a height of the insulating layer is substantially identical to that of the metallic layer.

2. The manufacturing method of the LED carrier as claimed in claim 1, further comprising:
   forming the insulating layer made of an insulating material on the substrate by photolithography or screen printing, wherein a height of the insulating layer is greater than that of the metallic layer; and
   polishing the insulating layer to align the height of the insulating layer substantially identical to that of the metallic layer, thereby the second pattern of the insulating layer is formed on the substrate.

3. The manufacturing method of the LED carrier as claimed in claim 2, wherein when the insulating material of the insulating layer is solder-resist ink, the insulating layer is formed by photolithography.

4. The manufacturing method of the LED carrier as claimed in claim 2, when the insulating material of the insulating layer is silicone or ceramic ink, the insulating layer is formed by screen printing.

5. The manufacturing method of the LED carrier as claimed in claim 1, further comprising:
   forming a reflecting layer on at least one of the first pattern and the second pattern by photolithography or screen printing.

6. The manufacturing method of the LED carrier as claimed in claim 5, further comprising:
   roughening at least one of the metallic layer having the first pattern and the insulating layer having the second pattern to dispose the reflecting layer, wherein an arithmetical mean roughness (Ra) of a top surface of the metallic layer and a top surface of the insulating layer is smaller than or equal to 1 μm.

7. The manufacturing method of the LED carrier as claimed in claim 6, wherein a ten-point mean roughness (Rz) of the top surface of the insulating layer and the top surface of the metallic layer is smaller than or equal to 5 μm.

8. The manufacturing method of the LED carrier as claimed in claim 1, wherein the first pattern has a die bonding region and a ring-shaped wiring region separated from the die bonding region, wherein the manufacturing method of the LED carrier further comprises:
   forming the insulating layer on the substrate by filling an insulating material in an insulating region defined by a side wall of the die bonding region, a side wall of the ring-shaped wiring region, and a top surface of the substrate.

9. The manufacturing method of the LED carrier as claimed in claim 8, wherein a top surface of the die bonding region and a top surface of the ring-shaped wiring region are coplanar.

10. The manufacturing method of the LED carrier as claimed in claim 8, further comprising:
    forming a reflecting layer on a top surface of the die bonding region and part of a top surface of the insulating layer by photolithography or the screen printing.

11. The manufacturing method of the LED carrier as claimed in claim 10, wherein a portion of the top surface of the reflecting layer arranged on the top surface of the die bonding region is formed as a flat surface and is substantially parallel to the top surface of the die bonding region.

12. The manufacturing method of the LED carrier as claimed in claim 11, wherein a portion of the top surface of the reflecting layer arranged on the insulating layer is formed as a curved surface and surrounds the flat surface.

13. A manufacturing method of an LED carrier, comprising:
    providing a substrate;
    forming a metallic layer having a die bonding region and a ring-shaped wiring region separated from the die bonding region; and
    forming an insulating layer on the substrate and the die bonding region, wherein the insulating layer covers entirely a top surface of the die bonding region and a side wall of the die bonding region, and a gap exists between a side wall of the insulating layer and a side wall of the ring-shaped wiring region.

14. The manufacturing method of the LED carrier as claimed in claim 13, further comprising:
    forming a reflecting layer on a portion of a top surface of the insulating layer, wherein a periphery portion of the top surface of the insulating layer is not covered by the reflecting layer.

15. The manufacturing method of the LED carrier as claimed in claim 13, wherein a thickness of a portion of the insulating layer disposed on the die bonding region is 50% smaller than a thickness of the die bonding region.

16. The manufacturing method of the LED carrier as claimed in claim 13, wherein the top surface of the die bonding region and a top surface of the ring-shaped wiring region are coplanar.

17. A manufacturing method of an LED carrier, comprising:
    providing a substrate;
    forming a metallic layer having a die bonding region and a ring-shaped wiring region separated from the die bonding region; and
    forming an insulating layer on the substrate, wherein a top surface of the insulating layer is lower than a top surface of the die bonding region and a top surface of the ring-shaped wiring region, a first gap is formed between the insulating layer and a side wall of the die bonding region and a second gap is formed between the insulating layer and a side wall of the ring-shaped wiring region.

18. The manufacturing method of the LED carrier as claimed in claim 17, further comprising:
    forming a reflecting layer on the top surface of the die bonding region and part of the top surface of the insulating layer, wherein the reflecting layer is fully filled in the first gap.

19. The manufacturing method of the LED carrier as claimed in claim 17, wherein the top surface of the die bonding region and a top surface of the ring-shaped wiring region are coplanar.

20. The manufacturing method of the LED carrier as claimed in claim 17, wherein the side wall of the die bonding region and the side wall of the ring-shaped wiring region each faces toward the insulating layer.

* * * * *